(12) United States Patent
Shrivastava et al.

(10) Patent No.: US 9,401,352 B2
(45) Date of Patent: Jul. 26, 2016

(54) FIELD-EFFECT DEVICE AND MANUFACTURING METHOD THEREOF

(71) Applicant: Infineon Technologies AG, Neubiberg (DE)

(72) Inventors: Mayank Shrivastava, Essex Junction, VT (US); Harald Gossner, Riemerling (DE); Ramgopal Rao, Mumbai (IN); Maryam Shojaei Baghini, Mumbai (IN)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/712,701

(22) Filed: May 14, 2015

(65) Prior Publication Data

US 2015/0255450 A1    Sep. 10, 2015

Related U.S. Application Data

(60) Division of application No. 13/740,048, filed on Jan. 11, 2013, now Pat. No. 9,035,375, which is a continuation of application No. 12/188,774, filed on Aug. 8, 2008, now Pat. No. 8,354,710.

(51) Int. Cl.
*H01L 21/762* (2006.01)
*H01L 27/02* (2006.01)
(Continued)

(52) U.S. Cl.
CPC ...... *H01L 27/0266* (2013.01); *H01L 21/26513* (2013.01); *H01L 21/26586* (2013.01); *H01L 21/76224* (2013.01); *H01L 29/0653* (2013.01); *H01L 29/0834* (2013.01); *H01L 29/0847* (2013.01); *H01L 29/0878* (2013.01); *H01L 29/1045* (2013.01); *H01L 29/1095* (2013.01);
(Continued)

(58) Field of Classification Search
CPC ............. H01L 21/762; H01L 21/265; H01L 21/26513; H01L 21/26586; H01L 21/76224; H01L 29/06; H01L 29/10; H01L 29/66; H01L 29/78; H01L 29/66681; H01L 29/7816; H01L 27/02
USPC ......................... 438/142, 590, 285, 286, 291
See application file for complete search history.

(56) References Cited

U.S. PATENT DOCUMENTS 5,493,142 A    2/1996 Randazzo et al.
5,731,603 A    3/1998 Nakagawa et al.
(Continued)

FOREIGN PATENT DOCUMENTS

DE    102005022129 A1    11/2006

OTHER PUBLICATIONS

Boselli, G., et al., "Drain Extended nMOS High Current Behavior and ESD Protection Strategy for HV Applications in Sub-100nm CMOS Technologies," IEEE, 45th Annual International Reliability Physics Symposium, 2007, pp. 342-347.
(Continued)

*Primary Examiner* — Chuong A Luu
(74) *Attorney, Agent, or Firm* — Slater Matsil, LLP

(57) ABSTRACT

Embodiments relate to a field-effect device that includes a body region, a first source/drain region of a first conductivity type, a second source/drain region, and a pocket implant region adjacent to the first source/drain region, the pocket implant region being of a second conductivity type, wherein the second conductivity type is different from the first conductivity type. The body region physically contacts the pocket implant region.

20 Claims, 16 Drawing Sheets

(51) Int. Cl.
*H01L 21/265* (2006.01)
*H01L 29/06* (2006.01)
*H01L 29/08* (2006.01)
*H01L 29/10* (2006.01)
*H01L 29/739* (2006.01)
*H01L 29/78* (2006.01)
*H01L 29/66* (2006.01)

(52) U.S. Cl.
CPC .... *H01L 29/66659* (2013.01); *H01L 29/66681* (2013.01); *H01L 29/7393* (2013.01); *H01L 29/7816* (2013.01); *H01L 29/7835* (2013.01); *H01L 29/1083* (2013.01); *H01L 29/66537* (2013.01); *H01L 2924/0002* (2013.01)

(56) References Cited

U.S. PATENT DOCUMENTS

| | | |
|---|---|---|
| 5,780,902 A | 7/1998 | Komuro |
| 5,844,275 A | 12/1998 | Kitamura et al. |
| 5,903,032 A | 5/1999 | Duvvury |
| 5,946,177 A | 8/1999 | Miller et al. |
| 5,982,600 A | 11/1999 | Cheng |
| 6,071,768 A | 6/2000 | Duvvury et al. |
| 6,100,125 A | 8/2000 | Hulfachor et al. |
| 6,310,380 B1 | 10/2001 | Cai et al. |
| 6,441,431 B1 | 8/2002 | Efland et al. |
| 6,521,946 B2 | 2/2003 | Mosher |
| 6,596,594 B1 | 7/2003 | Guo |
| 6,599,804 B2 | 7/2003 | Bulucea et al. |
| 6,614,077 B2 | 9/2003 | Nakamura et al. |
| 7,776,700 B2 | 8/2010 | Yang et al. |
| 7,821,062 B2 | 10/2010 | Gossner |
| 8,354,710 B2 | 1/2013 | Shrivastava et al. |
| 2008/0023767 A1 | 1/2008 | Voldman |
| 2008/0166849 A1* | 7/2008 | Yang ............ H01L 29/0847 438/305 |
| 2009/0273028 A1 | 11/2009 | Mallikarjunaswamy et al. |

OTHER PUBLICATIONS

Duvvury, C., et al., "Achieving Uniform nMOS Device Power Distribution for Sub-Micron ESD Reliability," IEDM, IEEE, 1992, pp. 6.1.1-6.1.4.

Duvvury, C., et al., "Efficient NPN Operation in High Voltage NMOSFET for ESD Robustness," IEDM, IEEE, 1995, pp. 14.3.1-14.3.4.

Esmark, K., et al., "Advanced Simulation Methods for ESD Protection Development," Elsevier, 2003, 305 pages.

Keller, J., "Protection of MOS Integrated Circuits from Destruction by Electrostatic Discharge," Proceedings of EOS/ESD Symposium, 1980, pp. 73-80.

McPhee, R.A., et al., "Thick Oxide Device ESD Performance Under Process Variations," EOS/ESD Symposium Proceedings, 1986, pp. 173-181.

Pallela, A., et al., "A Design Methodology for ESD Protection Networks," EOS/ESD Symposium Proc. EOS-7, 1985, pp. 24-33.

\* cited by examiner

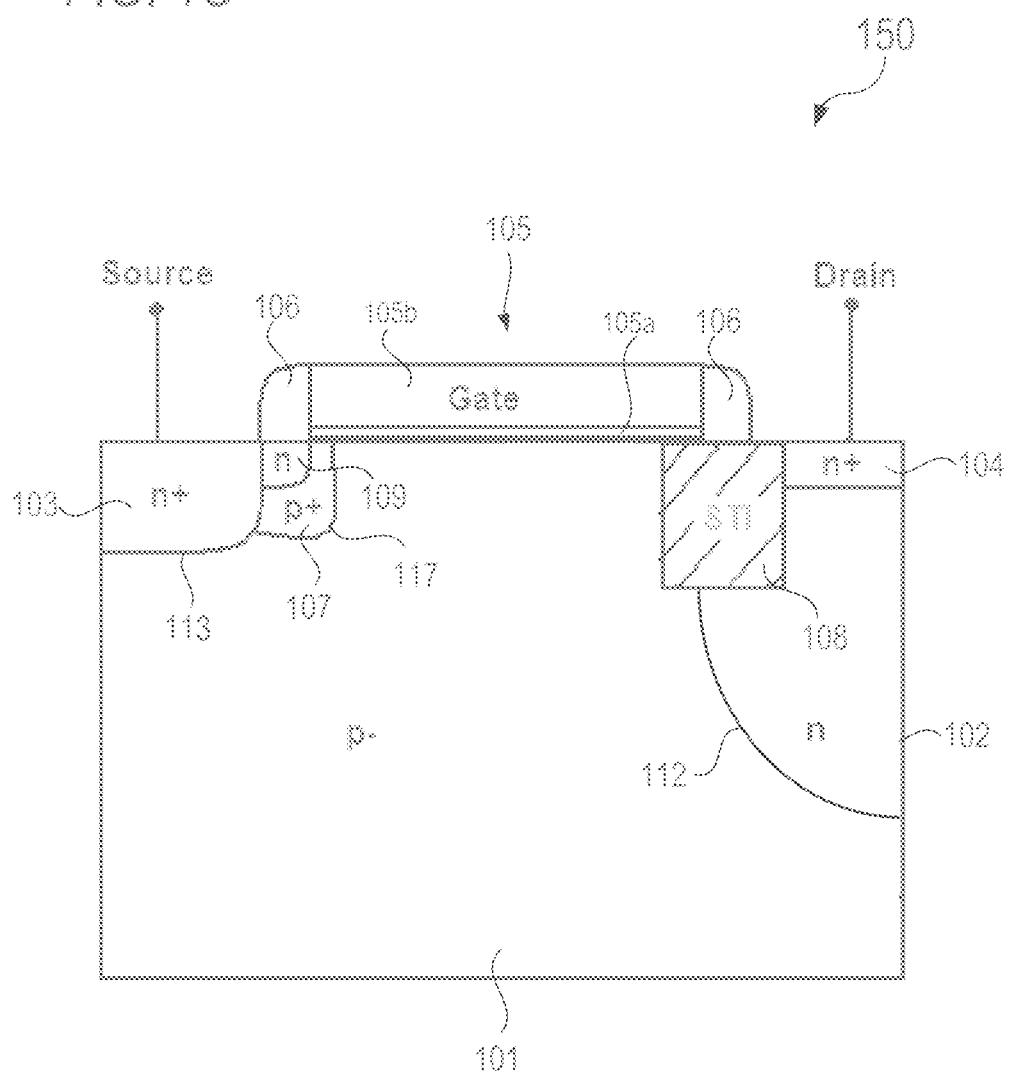

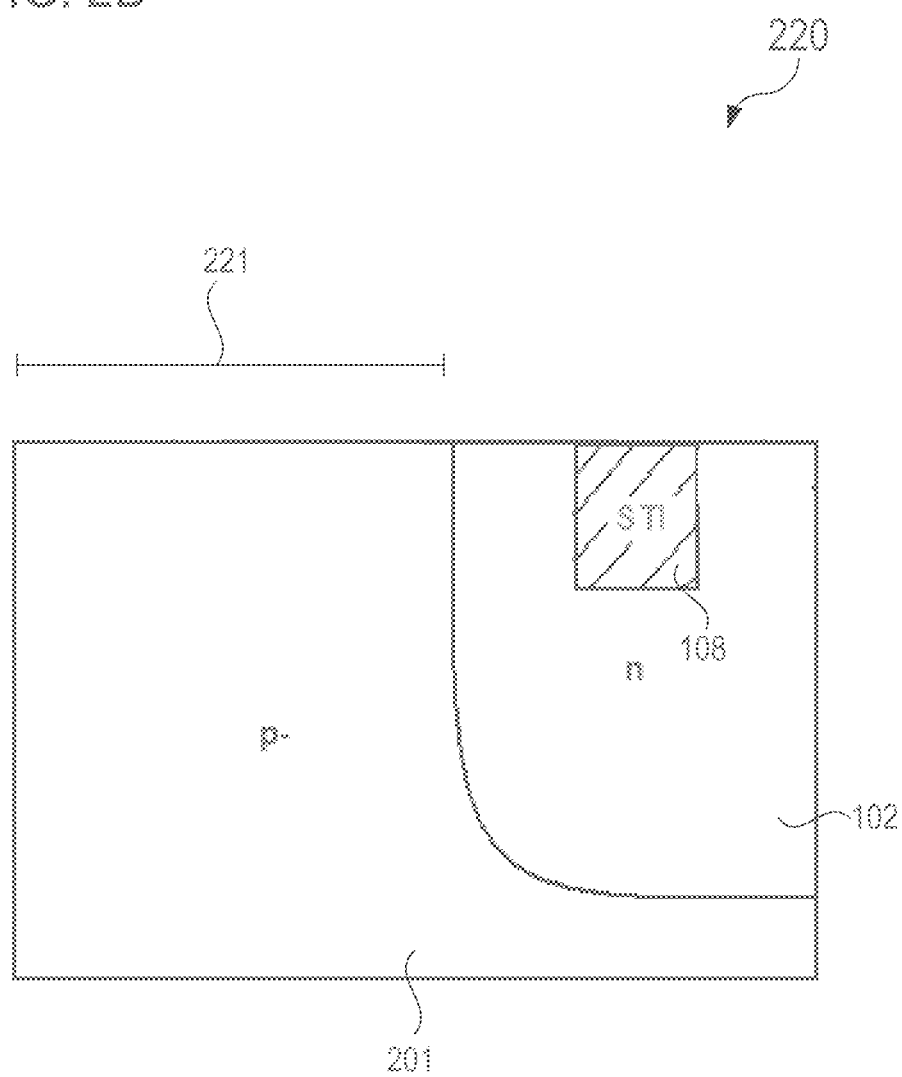

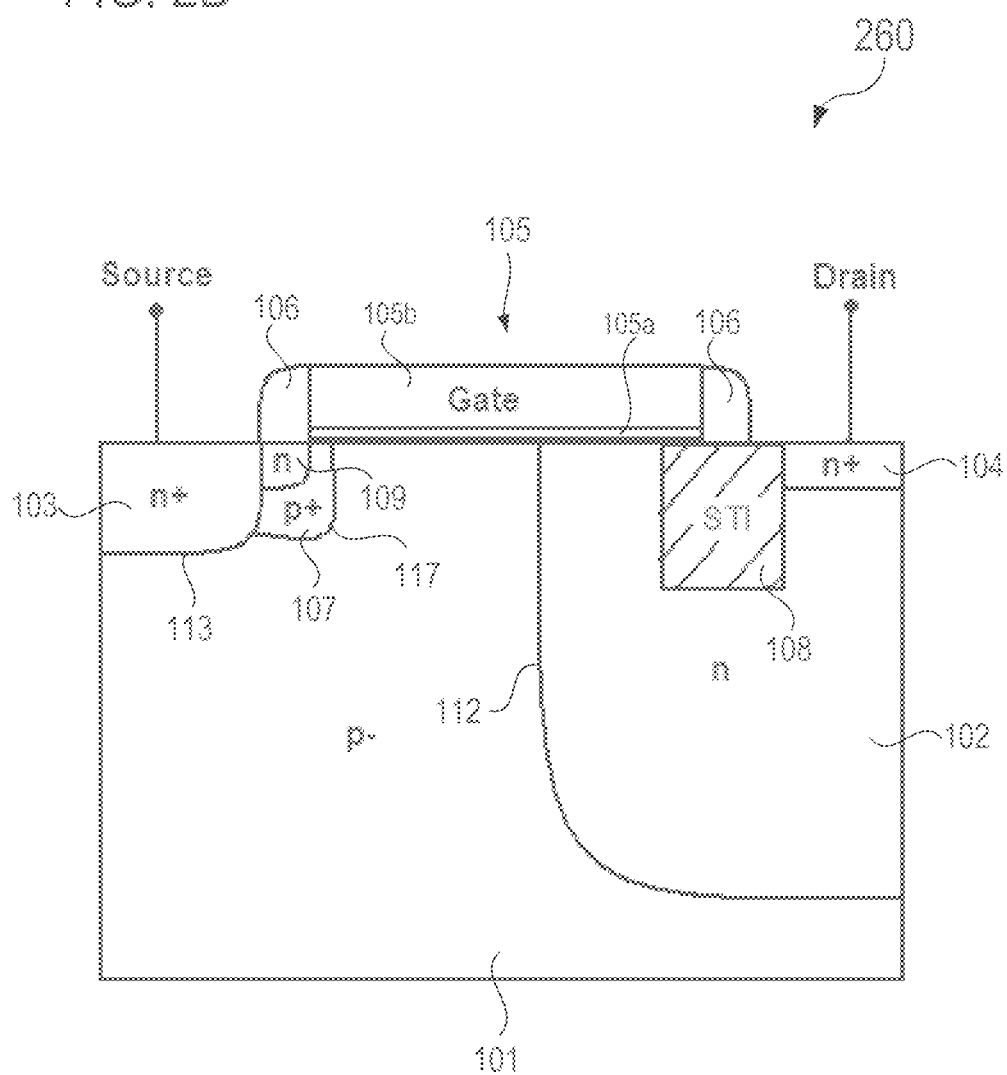

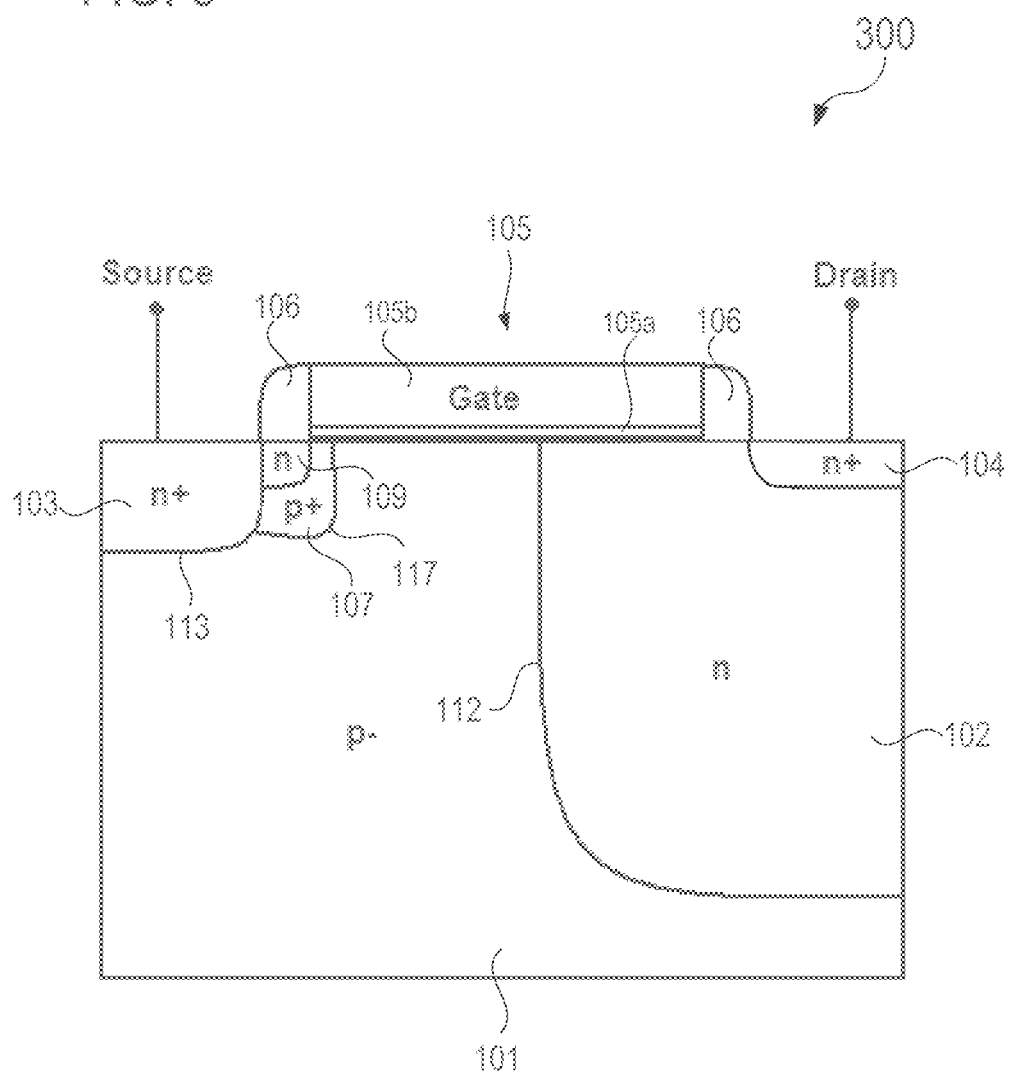

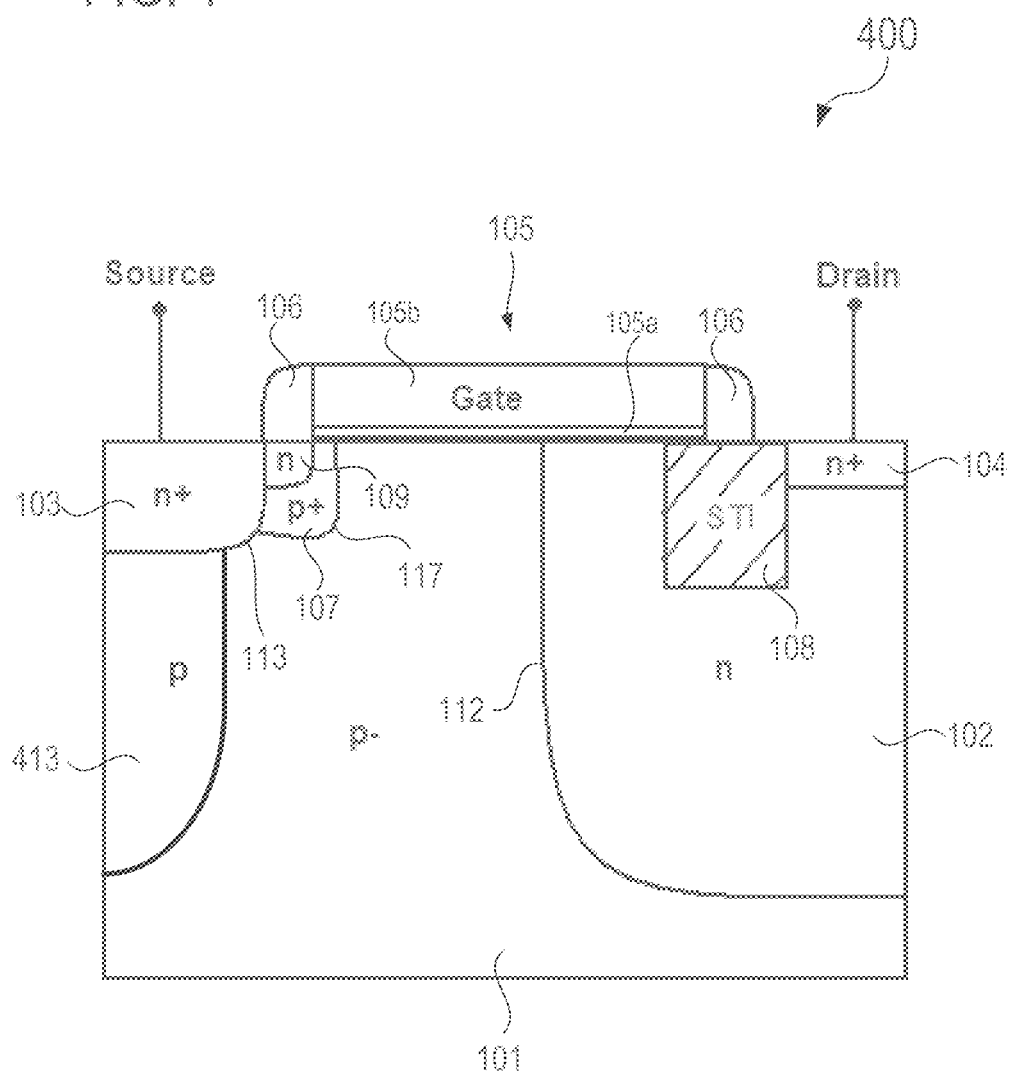

US 9,401,352 B2

FIELD-EFFECT DEVICE AND MANUFACTURING METHOD THEREOF

This is a divisional application of U.S. application Ser. No. 13/740,048, filed on Jan. 11, 2013 and issued as U.S. Pat. No. 9,035,375 on May 19, 2015 which is a continuation application of U.S. application Ser. No. 12/188,774, filed on Aug. 8, 2008 and issued as U.S. Pat. No. 8,354,710 on Jan. 15, 2013, both of which are incorporated herein by reference.

TECHNICAL FIELD

Embodiments relate generally to a field-effect device and a manufacturing method thereof.

BACKGROUND

In order to protect integrated circuit (IC) devices against damage caused by electrostatic discharge (ESD), special device elements called ESD protection elements may be used. In this context, it may be useful to have ESD protection elements which may be compliant with an interface voltage in the range from about 5 V to 12 V for an input/output (I/O) circuit implemented in a system on chip (SoC). These SoC ICs may be produced in advanced CMOS (Complementary Metal Oxide Semiconductor) technologies where no gate oxides of appropriate thickness may be available. One option is to use so-called drain-extended MOS (DEMOS) devices for I/O drivers, which are asymmetric with respect to the drain and source construction. The specific drain construction in these devices may allow to drop the voltage along the drain to a lower, less critical value at the gate. However, these devices are known to be ESD-weak in general and a self-protection can hardly be achieved.

Concepts that have been or are used to protect high-voltage I/O circuits ($V_{signal}$>5 V) of advanced CMOS ICs include the following:

Above 1 μm technology, thick-oxide or field-oxide devices have commonly been used. In those technologies, lateral parasitic NPN transistors were used for ESD protection. With technology scaling reaching the deep submicron and sub 100 nm regime, the performance of these protection devices degrades since in thin-oxide devices the breakdown voltage of an I/O device matches more closely to the trigger voltage of the protection device. In many cases, grounded-gate NMOS (ggNMOS) transistors are used, which are CMOS compatible. In sub 100 nm node technology, silicon controlled rectifiers (SCR) or thyristors have widely been used, but they are generally not CMOS process compatible which leads to higher cost. Stacked NMOS devices may be used for ESD protection, but they usually cannot survive high voltages due to junction breakdown effects.

Thin-oxide MOS field-effect transistors (MOSFET) connected in grounded-gate configuration form a lateral NPN transistor with Collector (formed by the Drain), Emitter (formed by the Source) and Base (formed by the Substrate) which may be used for ESD protection. In single-finger structures, triggering of the lateral NPN transistor for ESD protection may be relatively difficult to achieve, which commonly leads to an ESD performance below 2 kV (HBM: Human Body Model). By means of a proper gate-to-drain coupling (or through substrate pumping) to generate enough substrate current during ESD stress, the ESD level may be enhanced to more than 6 kV. Another possibility to achieve a sufficient level of ESD robustness may be the use of substrate and gate biasing.

BRIEF DESCRIPTION OF THE DRAWINGS

In the drawings, like reference characters generally refer to the same parts throughout the different views. The drawings are not necessarily to scale, emphasis instead generally being placed upon illustrating the principles of various embodiments. In the following description, various embodiments are described with reference to the following drawings, in which:

FIG. 1C shows a field-effect transistor in accordance with an embodiment;

FIGS. 2A to 2D show a method for manufacturing a field-effect transistor in accordance with an embodiment;

FIG. 3 shows a field-effect transistor in accordance with an embodiment;

FIG. 4 shows a field-effect transistor in accordance with an embodiment;

DETAILED DESCRIPTION OF ILLUSTRATIVE EMBODIMENTS

Figure 1A:
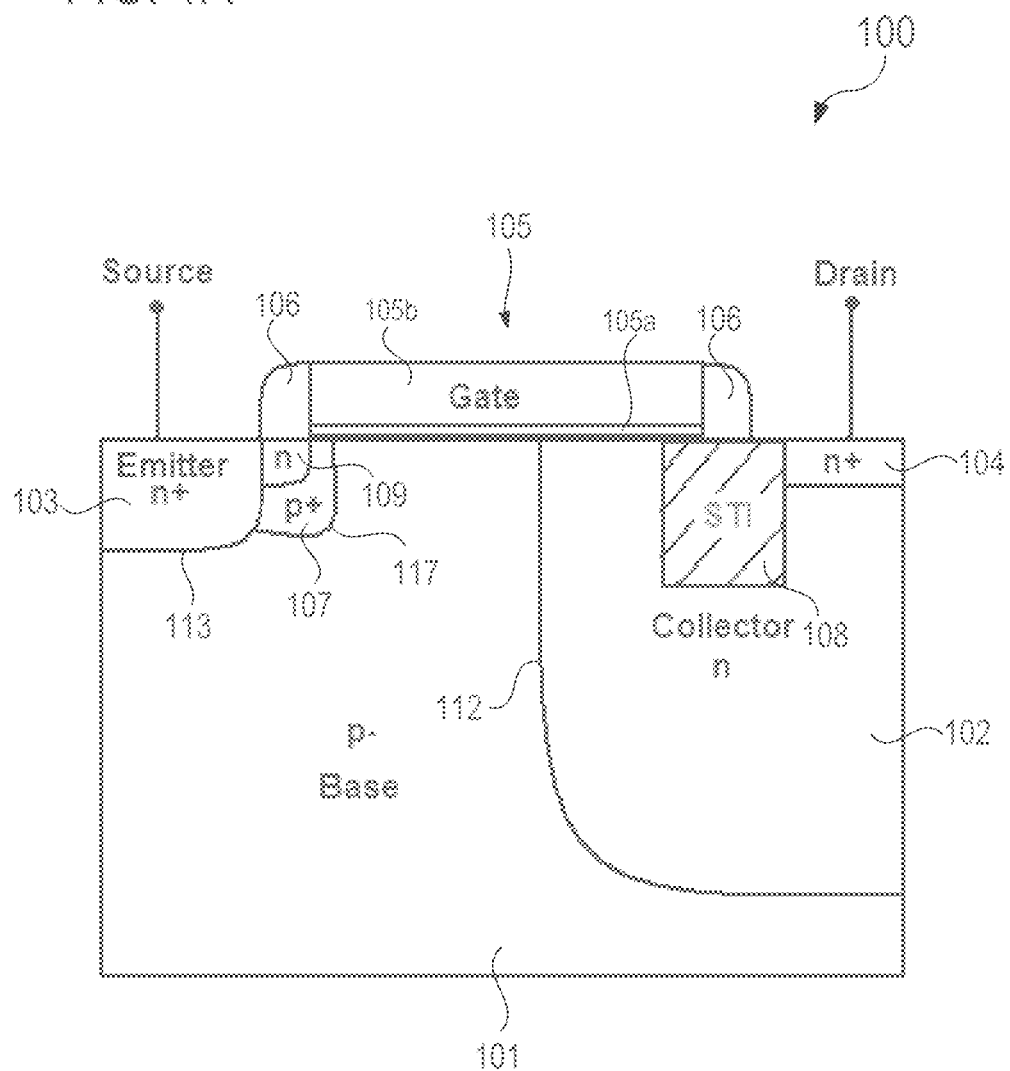
FIG. 1A shows a field-effect transistor in accordance with an embodiment.

FIG. 1A shows a cross-sectional view of a field-effect transistor 100 in accordance with an embodiment. The field-effect transistor 100 includes a first source/drain region 103 of a first conductivity type, a second source/drain region 104 of the first conductivity type, and an implant region 107 adjacent to the first source/drain region 103, the implant region 107 being of a second conductivity type, wherein the second conductivity type is different from the first conductivity type.

In accordance with an embodiment, the implant region 107 may be formed by a pocket implantation (or halo implantation) as will be described further below. Thus, the implant region 107 may also be referred to as a pocket implant region.

In accordance with some embodiments, the pocket implant region 107 may be disposed between the first source/drain region 103 and the second source/drain region 104 of the field-effect transistor 100, as shown in FIG. 1A. In accordance with one embodiment, the pocket implant region 107 may have a common interface with the first source/drain region 103. In accordance with one embodiment, the pocket implant region 107 may be separated from the second source/drain region 104.

In accordance with an embodiment, the field-effect transistor 100 may be configured as an n-type field-effect transistor. In this case, the first conductivity type may be an n-type conductivity type and the second conductivity type may be a p-type conductivity type, as shown in FIG. 1A. In accordance with an alternative embodiment, the first and second conductivity types may be reversed.

In accordance with an embodiment, the first source/drain region 103 may be configured as a source region or source of the field-effect transistor 100 and the second source/drain region 104 may be configured as a drain region or drain of the field-effect transistor 100. The first and second source/drain regions 103, 104 may be contacted by respective source and drain contacts, as shown in FIG. 1A.

In accordance with an embodiment, the first source/drain region 103 and the second source/drain region 104 may be n-doped, e.g. highly n-doped, for example n+ doped (as shown in FIG. 1A).

In accordance with an embodiment, the pocket implant region 107 may have a doping concentration that is different from a well doping concentration. In other words, the doping concentration level in the pocket implant region 107 may be different from a doping concentration level that is commonly present in a doped well (or well region). For example, in accordance with an embodiment, the doping concentration level in the pocket implant region 107 may be higher than a typical doping concentration level of a well. In accordance with an embodiment, the doping concentration level in the pocket implant region 107 may be comparable to the doping concentration level in the source/drain regions 103, 104.

In accordance with an embodiment, the pocket implant region 107 may be p-doped, e.g. highly p-doped, for example p+ doped, as shown in FIG. 1A.

In accordance with an embodiment, the field-effect transistor 100 may further include a body region 101 that may physically contact the pocket implant region 107. In other words, the body region 101 and the pocket implant region 107 may have a common interface 117, as shown in FIG. 1A. In accordance with another embodiment, the body region 101 may also physically contact the first source/drain region 103. That is, in accordance with this embodiment the body region 101 and the first source/drain region 103 may also have a common interface 113 (as shown in FIG. 1A). In an embodiment, the body region 101 may be understood as a region being located at least partially underneath a gate ragion and a source contact, which only contains the background doping of the substrate or the epitaxial-layer. In an embodiment, no additional implant like well implants is applied in a body region 101.

In accordance with an embodiment, the pocket implant region 107 may be separated from the second source/drain region 104 by the body region 101, as shown in FIG. 1A.

In accordance with an embodiment, the body region 101 may have an intrinsic doping concentration, e.g. a p- doping concentration, as shown in FIG. 1A.

In accordance with an embodiment, the field-effect transistor 100 may further include a well region 102 formed in the body region 101, wherein the second source/drain region 104 may be formed in the well region 102.

In accordance with an embodiment, the well region 102 may be of the first conductivity type, i.e. of an n-type conductivity type in accordance with the embodiment shown in FIG. 1A. In other words, the well region 102 of the field-effect transistor 100 may have the same conductivity type as the first and second source/drain regions 103, 104. The well region 102 may be n-doped and may have a doping concentration that may be higher than the doping concentration of the body region 101 and lower than the doping concentration of the second source/drain region 104 in accordance with some embodiments.

In accordance with an embodiment, the well region 102 may serve as a drain extension of the field effect-transistor 100. Thus, the field-effect transistor may also be referred to as drain-extended field effect transistor.

In accordance with an embodiment, the field-effect transistor 100 may be formed in or on a semiconductor substrate or wafer, e.g. in or on a silicon substrate or wafer.

In accordance with an embodiment, the field-effect transistor 100 may further include a gate region (or gate stack) 105 including a gate-insulating layer (or gate dielectric) 105a and a conductive gate layer (or gate) 105b disposed over the gate-insulating layer 105a. The gate-insulating layer 105a may include or may be formed of suitable gate dielectric materials, such as an oxide material or other known gate dielectric materials. Similarly, the conductive gate layer 105b may include or may be formed of suitable gate materials, such as polysilicon, a metal, or other known gate materials. Sidewall spacers 106 may be formed over the sidewalls of the gate region 105, as shown in FIG. 1A.

In accordance with an embodiment, the pocket implant region 107 may be laterally adjacent to a side of the first source/drain region 103 that faces the gate region 105, as shown in FIG. 1A.

In accordance with an embodiment, the gate region 105 may be formed over the body region 101 and over the well region 102 (if present), between the first and second source/drain regions 103, 104. For example, the gate region 105 may overlap the well region 102. In other words, the well region 102 may extend from the second source/drain region 104 as far as the gate-insulating layer 105a of the gate region 105.

In accordance with an embodiment, the field-effect transistor 100 may be configured as a metal insulator semiconductor (MIS) field-effect transistor, e.g. as a metal oxide semiconductor (MOS) field-effect transistor in accordance with an embodiment.

In accordance with an embodiment, the field-effect transistor 100 may be configured as an n-type MOS (NMOS) field-effect transistor with conductivity types of the individual regions (i.e. body region 101, well region 102, source/drain regions 103, 104, pocket implant region 107) of the transistor 100 being as shown in FIG. 1A. Alternatively, the field-effect transistor 100 may be configured as a p-type MOS (PMOS) field-effect transistor, wherein the conductivity types of the individual regions may be reversed.

In case that the field-effect transistor 100 is configured as a MOS field-effect transistor it may also be referred to as drain-extended MOS (DEMOS) field-effect transistor.

In accordance with an embodiment, the pocket implant region 107 may be formed partially under the gate region 105. That is, the pocket implant region 107 may have a common interface with the gate-insulating layer 105a of the gate region 105, as shown in FIG. 1A.

In accordance with an embodiment, the field-effect transistor 100 may further include a shallow trench isolation (STI) region 108 that may be formed in the well region 102. The shallow trench isolation region 108 may be disposed laterally adjacent to the second source/drain region 104. That is, the shallow trench isolation region 108 may have a common interface with the second source/drain region 104 and may be disposed between the second source/drain region 104 and an interface 112 between the well region 102 and the body region 101.

In accordance with an embodiment, the gate region 105 may at least partially overlap the shallow trench isolation region 108, as shown in FIG. 1A.

Figure 1B:
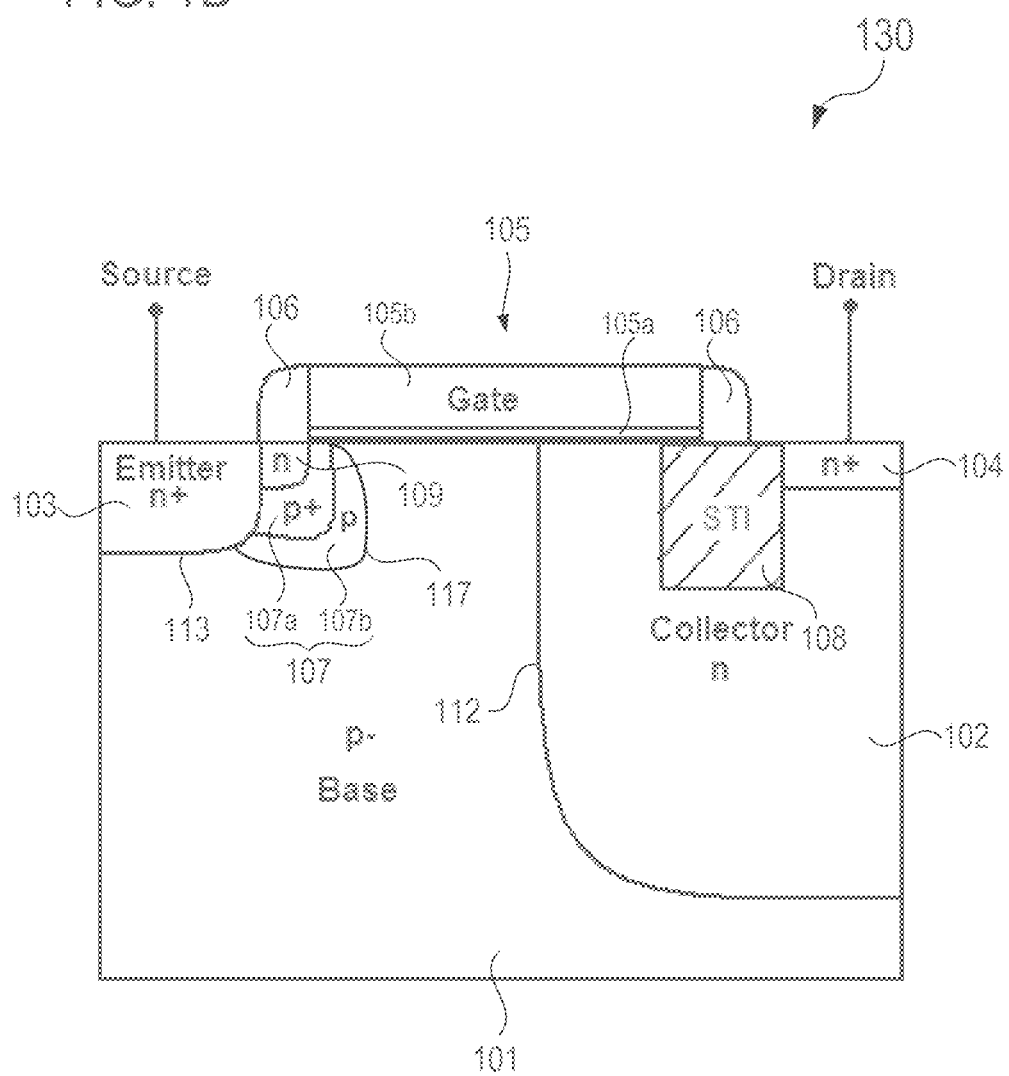
FIG. 1B shows a field-effect transistor in accordance with an embodiment.

In accordance with an embodiment, the field-effect transistor 100 may have a graded doping profile at the side of the first source/drain region 103 (i.e. at the source side in accordance with an embodiment), which may clearly be formed by the doped pocket implant region 107 and the intrinsic or lowly doped body region 101 (cf. FIG. 1B).

In accordance with an embodiment, the field-effect transistor 100 may include a doped region 109 disposed laterally adjacent to the first source/drain region 103 and between the first source/drain region 103 and the gate region 105. For example, the doped region 109 may be formed under a sidewall spacer 106 of the gate region that is proximate the first source/drain region 103. As shown in FIG. 1A, the doped region 109 may be of the first conductivity type (e.g. n-doped). In accordance with an embodiment, the doped region 109 may be formed by a LDD implant, as will be described further below.

Under certain conditions (e.g. under ESD conditions) the n+ doped first source/drain region 103, the intrinsic (p-doped) body region 101 and the n-doped well region 102 may function as a lateral NPN bipolar transistor, wherein the first source/drain region 103 may clearly form the emitter, the body region 101 may form the base, and the well region 102 may form the collector of the bipolar device, as is indicated in FIG. 1A.

In an embodiment, illustratively, there might be provided a current path beginning from the first source/drain region 103 via the pocket implant region 107, the common interface 117 directly into the the body region 101 (without being in another well region), the well region 102, around the shallow trench isolation (STI) region 108 to the second source/drain region 104.

FIG. 1B shows a field-effect transistor 130 in accordance with an embodiment. The field-effect transistor 130 is different from the field-effect transistor 100 shown in FIG. 1A in that the pocket implant region 107 has a graded doping profile. A pocket implant region 107 with a graded doping profile may also be referred to as a graded pocket region. In accordance with an embodiment, the graded pocket region 107 may include a highly doped (e.g. p+ doped as shown in FIG. 1B) first subregion 107a and a second subregion 107b formed adjacent to the first subregion 107a and between the first subregion 107a and the body region 101, wherein the doping concentration of the second subregion 107b may be lower than the doping concentration of the highly doped first subregion 107a and higher than the doping concentration of the inrinsic or lowly doped body region 101. For example, the second subregion 107b may be p-doped as shown in FIG. 1B.

Clearly, the p+ doped first subregion 107a of the pocket implant region 107, the p-doped second subregion 107b of the pocket implant region 107 and the p- doped body region 101 form a graded p doping profile at the source side of the field-effect transistor 130, in other words at the emitter-base junction of the parasitic bipolar device. In other words, the parasitic bipolar device of the field-effect transistor 130 has a graded base nature. One effect of the graded doping profile may be an improved current gain of the parasitic bipolar device.

FIG. 1C shows a field-effect transistor 150 in accordance with an embodiment. The field-effect transistor 150 is different from the field-effect transistor 100 shown in FIG. 1A in that the shallow trench isolation region 108 is disposed only partially in the well region 102. That is, a portion of the shallow trench isolation region 108 may physically contact (in other words, touch) the body region 101 in accordance with this embodiment.

In the following, a method for manufacturing a field-effect transistor similar to the one shown in FIG. 1A will be described with reference to the cross-sectional views shown in FIGS. 2A to 2D, in accordance with an embodiment.

Figure 2A:
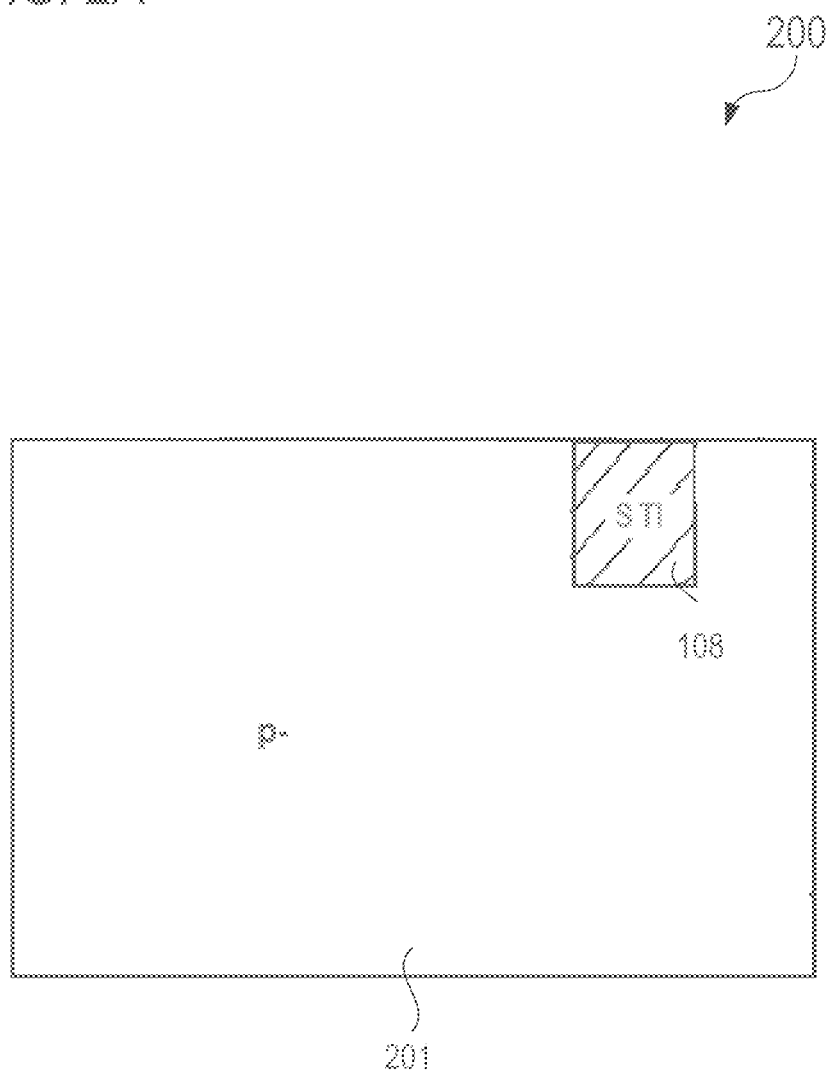

The structure 200 shown in FIG. 2A may be obtained by forming a shallow trench isolation (STI) region 108 in a substrate 201. In accordance with an embodiment, the substrate 201 may be a semiconductor substrate, e.g. a silicon substrate, and may, for example, have an intrinsic doping concentration, e.g. a p- doping concentration as shown in FIG. 2A. In accordance with an embodiment, the base doping concentration may be less than an intrinsic body doping concentration. The shallow trench isolation region 108 may be formed using known processes including, for example, etching a trench into the substrate 201 and subsequently filling the trench with insulating material (e.g. oxide material).

The structure 220 shown in FIG. 2B may be obtained by implanting dopant atoms into a portion of the substrate 201, thereby forming a well region 102 in the substrate 201. In accordance with an embodiment, the dopant atoms may be n-type dopant atoms such that the well region 102 is n-doped, as shown in FIG. 2B. In other words, an n-well implantation may be carried out, thereby forming an n-well 102 in the substrate 201. The well region 102 may be formed such that the shallow trench isolation region 108 is disposed in the well region 102. In accordance with another embodiment, the well region 102 may be formed such that the shallow trench isolation region 108 is disposed only partially in the well region 102. In other words, in accordance with an embodiment, the well region 102 may be formed such that at least a portion of the shallow trench isolation region 108 may physically contact (in other words, touch) the body region 101 (cf. FIG. 1C). Furthermore, in accordance with an embodiment, a p-well implant may be blocked such the field-effect transistor to be manufactured remains free of a p-well. The blocking of the p-well implantation may, for example, be achieved using a blocking mask, which is represented schematically by reference numeral 221 in FIG. 2B.

Figure 2C:
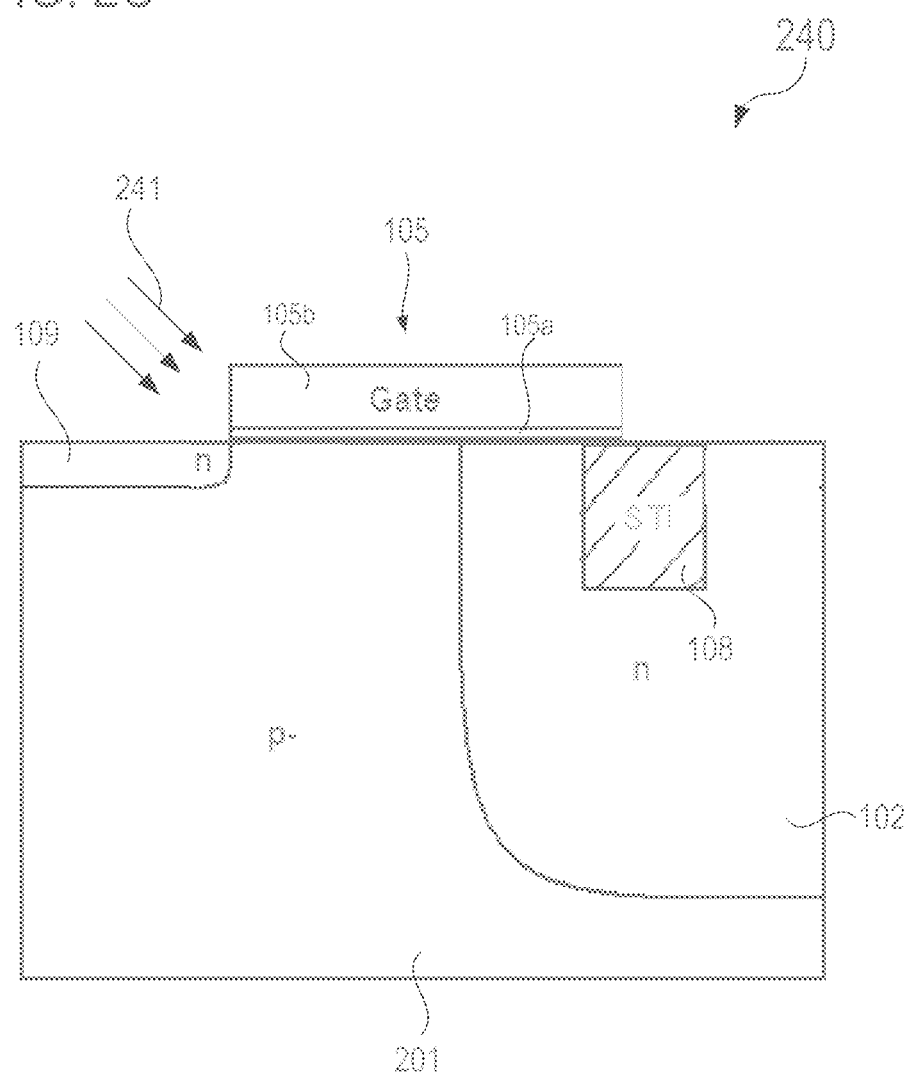

The structure 240 shown in FIG. 2C may be obtained by forming a gate region 105 over the substrate 201 and over the well region 102 formed in the substrate 201, wherein the gate region 105 includes a gate-insulating layer (gate dielectric) 105a and a conductive gate layer 105b disposed over the gate-insulating layer 105a. The gate region 105 may be formed by known processes including, for example, gate oxidation and gate patterning processes. In accordance with an embodiment, the gate region 105 may be formed such that it partially overlaps the shallow trench isolation region 108, as shown in FIG. 2C. Furthermore, a doped region 109 may be formed in the substrate 201 by means of a lightly doped drain (LDD) implantation. The doped region 109 may be n-doped, as shown in FIG. 2C. Subsequently, a pocket implantation or halo implantation (represented by arrows 241 in FIG. 2C) may be applied to form a pocket implant region 107 (cf. FIG. 2D) in the substrate 201. The pocket implantation may be configured as a tilted implantation such that the pocket implant region 107 extends laterally under the gate region 105. Furthermore, the pocket implantation may be configured as a p-type implantation such that the pocket implant region 107 will be p-doped, e.g. highly p-doped, for example p+ doped as shown in FIG. 2D.

The structure 260 shown in FIG. 2D may be obtained by the pocket implantation described above, and further by a spacer formation process for forming spacers 106 at the sidewalls of the gate region 105, followed by a source/drain implantation process for forming highly doped (e.g. n+ doped as shown in FIG. 2D) first and second source/drain regions 103, 104, and a contact formation for making electrical contact to the first and second source/drain regions 103, 104.

Thus, a field-effect transistor is obtained that is similar to the field-effect transistor 100 shown in FIG. 1A. The field-effect transistor shown in FIG. 2D has a single halo implant (pocket implant) at the source side, i.e. the pocket implant region 107. A portion of the substrate 201 that remains free of dopant implants (i.e. free of well implants, LDD implants, pocket implants and source/drain implants) may serve as a body region 101 of the field-effect transistor. The body region 101 may have the doping concentration of the substrate 201, i.e. it may have an intrinsic doping concentration (e.g. p-doping) as described above. In other words, the body region 101 may be considered as a region that does not include any additional well implants (e.g. n-well implants or p-well implants).

FIG. 3 shows a field-effect transistor 300 in accordance with another embodiment. The field-effect transistor 300 is different from the field-effect transistor 100 shown in FIG. 1A in that the shallow trench isolation region 108 is missing in the field-effect transistor 300. In accordance with an embodiment, the field-effect transistor 300 may be manufactured using a similar manufacturing method as described in connection with FIGS. 2A to 2D, wherein the STI formation illustrated in FIG. 2A may be omitted.

FIG. 4 shows a field-effect transistor 400 in accordance with another embodiment. The field-effect transistor 400 is different from the field-effect transistor 100 shown in FIG. 1A in that the field-effect transistor 400 further includes a second well region 413, wherein the first source/drain region 103 is formed partially in the second well region 413.

In the field-effect transistor 400 shown in FIG. 4, the second well region 413 is formed such that the body region 101 physically contacts the pocket imlant region 107 and the first source/drain region 103, i.e. the body region 101 and the pocket implant region 107 have a common interface 117, and the first source/drain region 103 and the body region 101 also have a common interface 113. In accordance with another embodiment, the second well region 413 may be formed such that the body region 101 still physically contacts the pocket implant region 107 but not the first source/drain region 103.

The second well region 413 may be of the second conductivity type, i.e. of the same conductivity type as the pocket implant region 107. In accordance with the embodiment shown in FIG. 4, the second well region 413 is p-doped, and may have, for example, a similar doping concentration as the well region 102. In accordance with an embodiment, the field-effect transistor 400 may be manufactured using a similar manufacturing method as described in connection with FIGS. 2A to 2D, without blocking the p-well implantation and thus with forming the second well region 413.

Figure 5:
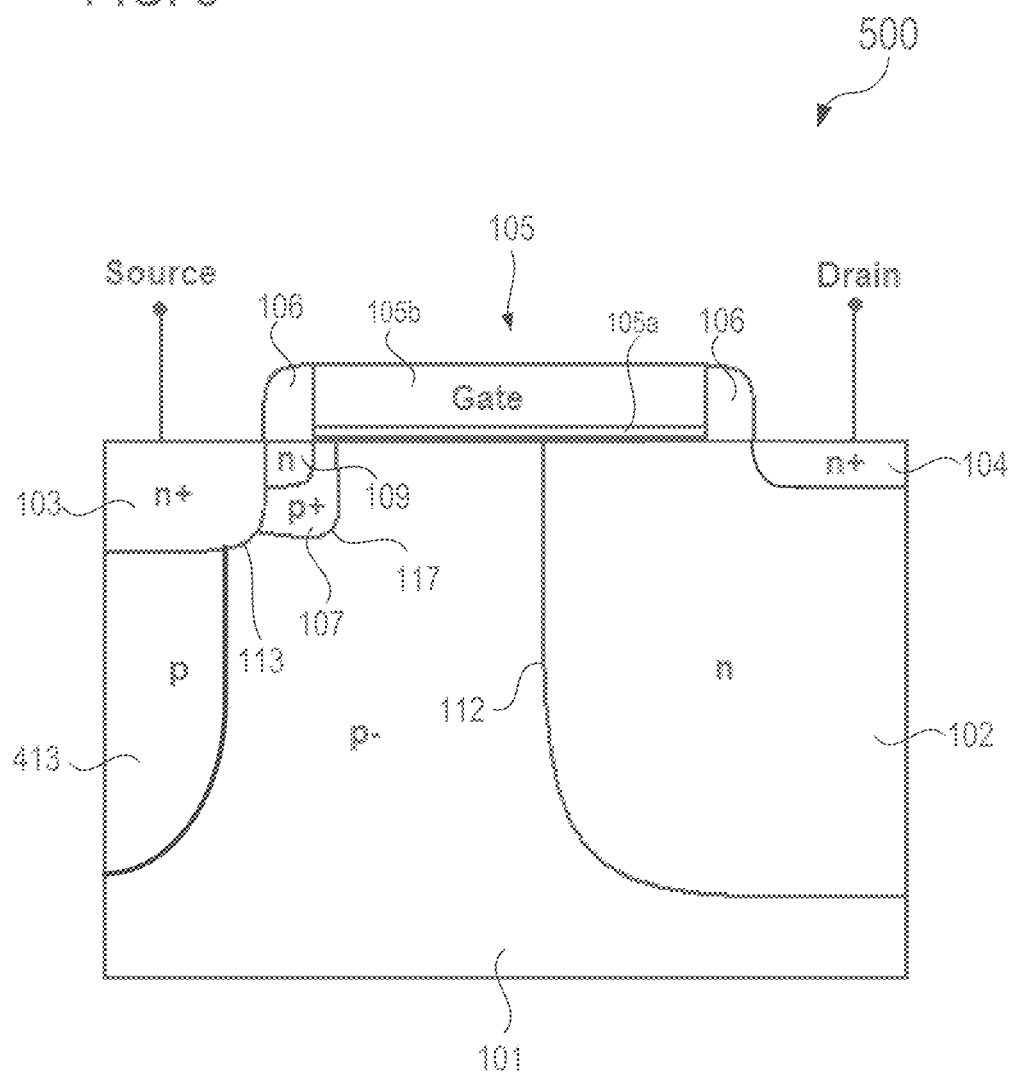
FIG. 5 shows a field-effect transistor in accordance with an embodiment.

FIG. 5 shows a field-effect transistor 500 in accordance with another embodiment. The field-effect transistor 500 is different from the field-effect transistor 400 of FIG. 4 in that the shallow trench isolation region 108 is missing in the field-effect transistor 500. In accordance with an embodiment, the field-effect transistor 500 may be manufactured using a similar manufacturing method as described in connection with FIGS. 2A to 2D, wherein the STI formation illustrated in FIG. 2A may be omitted, and an additional well implantation may be carried out for forming the second well region 413.

Figure 6:
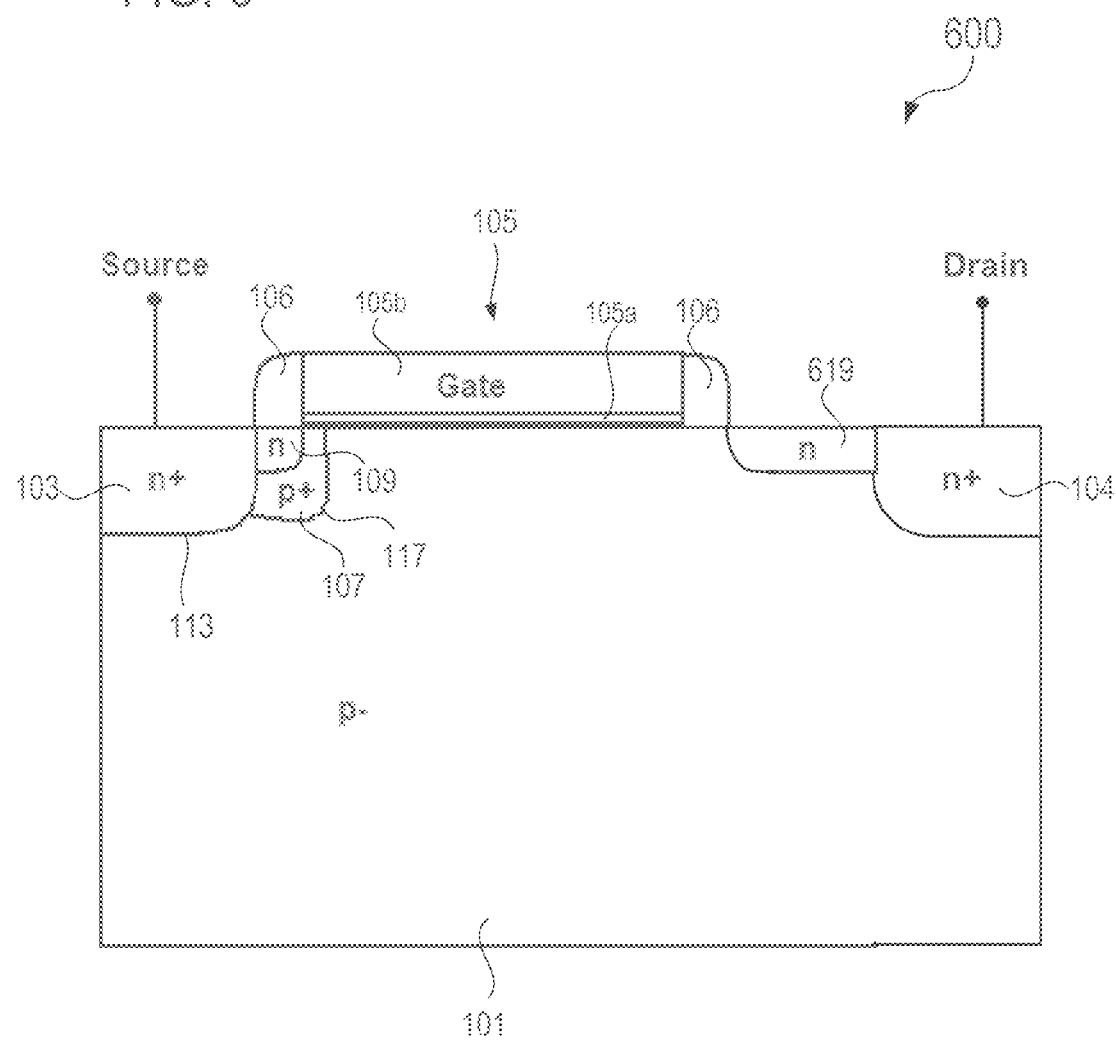
FIG. 6 shows a field-effect transistor in accordance with an embodiment.

FIG. 6 shows a field-effect transistor 600 in accordance with another embodiment. The field-effect transistor 600 is different from the field-effect transistor 300 shown in FIG. 3 in that the well region 102 is missing in the field-effect transistor 600. Furthermore, the field-effect transistor 600 includes a lightly doped drain (LDD) region 619 that is disposed laterally adjacent to the second source/drain region 104. The lightly doped drain region 619 may be of the first conductivity type, e.g. n-doped in accordance with the embodiment shown in FIG. 6.

Field-effect transistor devices in accordance with embodiments described herein may be used to achieve an improved ESD robustness and failure threshold of drain-extended field-effect transistor devices, e.g. DEMOS devices, with improved gate oxide reliability.

In accordance with some embodiments, no extra mask step is necessary in the fabrication process. In accordance with some embodiments, a single halo implantation at the source side and blocking of a p-well implantation are applied.

Figure 7:
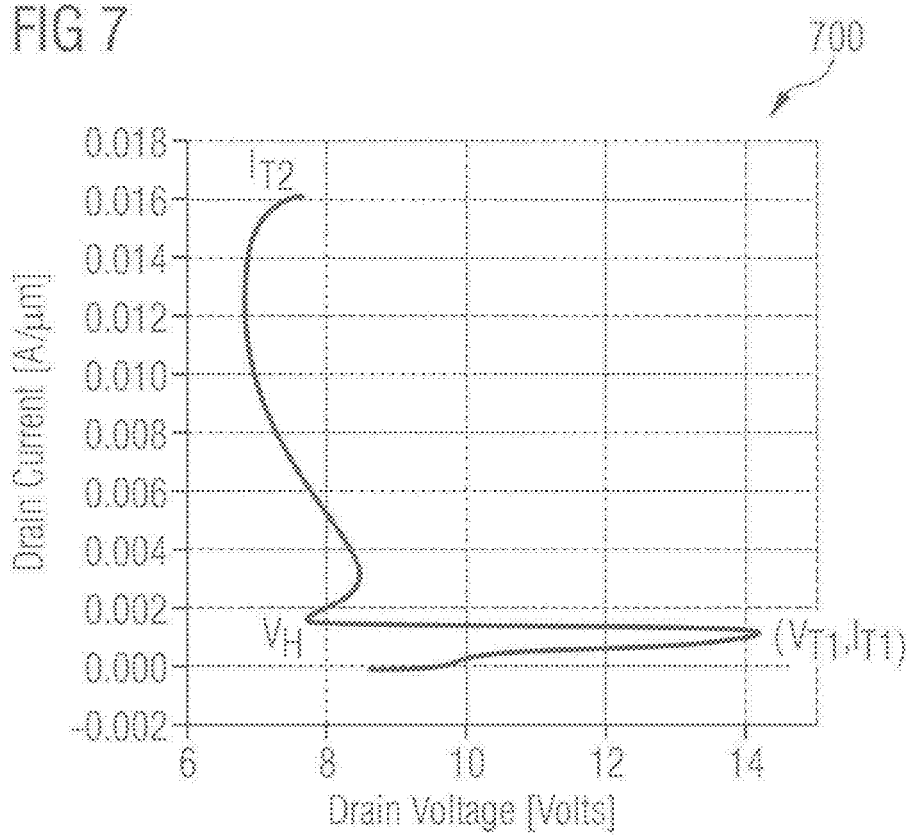
FIGS. 7 and 8 show diagrams illustrating certain characteristics of a field-effect transistor in accordance with an embodiment.

FIG. 7 shows a current-voltage diagram 700 for illustrating the snapback behavior of an NMOS field-effect transistor device in accordance with an embodiment, wherein the drain current is plotted versus the drain voltage. In the diagram 700, $V_{T1}$ and $I_{T1}$ indicate the bipolar turn-on voltage and current, $V_H$ indicates the bipolar holding voltage, and $V_{T2}$ and $I_{T2}$ indicate the second breakdown trigger voltage and current of the parasitic NPN bipolar transistor in the NMOS field-effect transistor.

Figure 8:
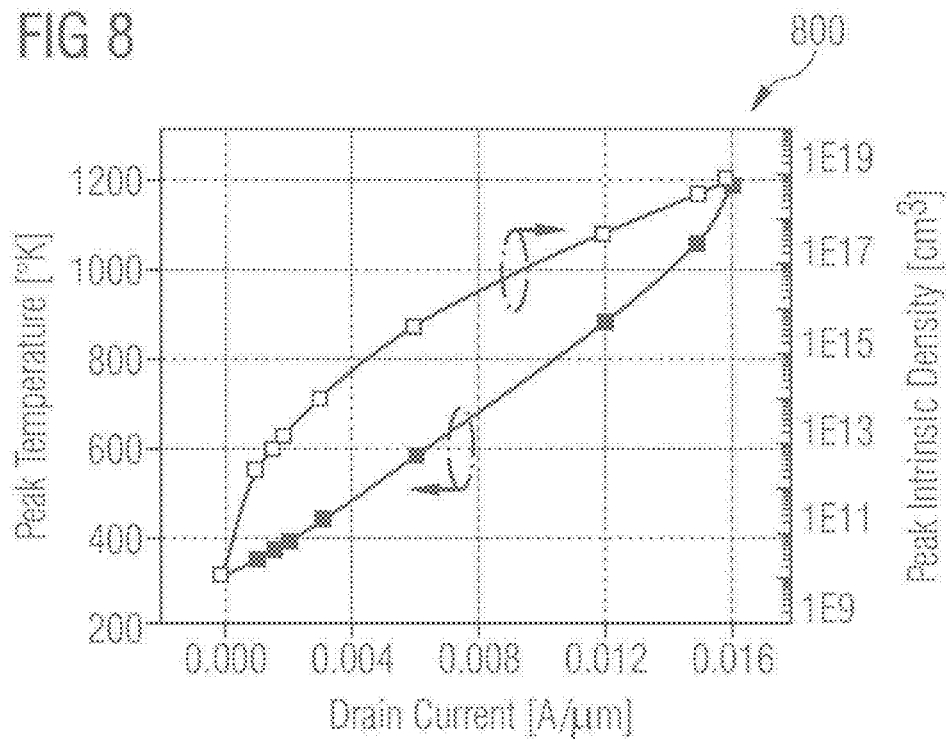

FIG. 8 shows a diagram 800 that may be used to determine $I_{T2}$ for a field-effect transistor in accordance with an embodiment. Shown are the peak temperature and the peak intrinsic density in the device versus the drain current. In the example illustrated, $I_{T2}$ is approximately 15 mA/μm, which is about 10 times higher than in conventional DEMOS devices.

Figure 9A:
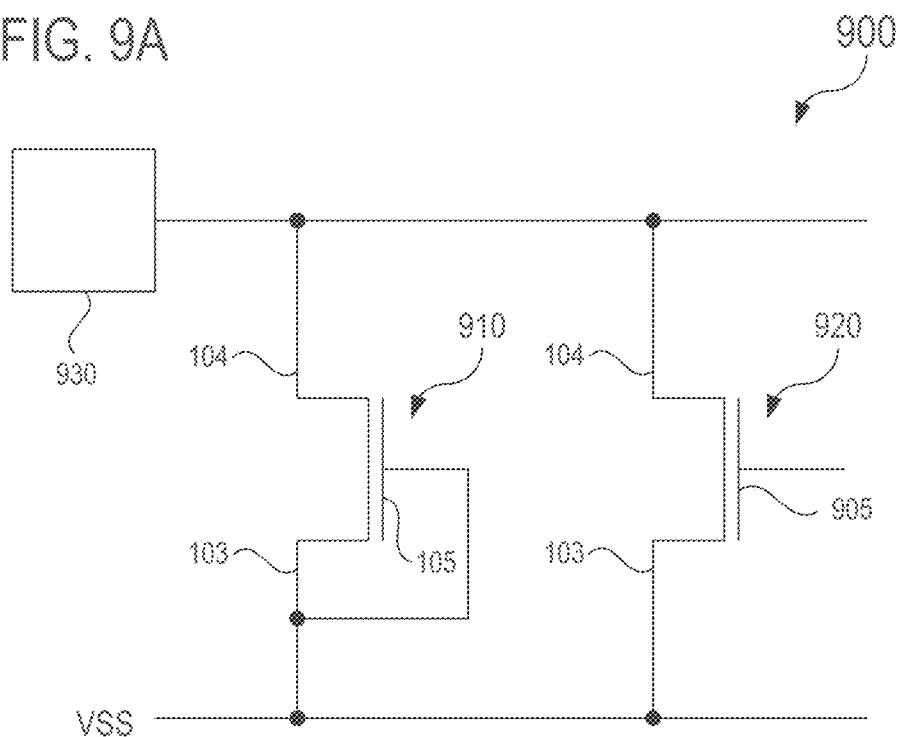
FIG. 9A shows a field-effect transistor arrangement in accordance with an embodiment.

FIG. 9A shows a field-effect transistor arrangement 900 in accordance with an embodiment. The field-effect transistor arrangement 900 includes a first field-effect transistor 910 and a second field-effect transistor 920.

The first field-effect transistor 910 of the field-effect transistor arrangement 900 may be configured in a similar manner as described herein in connection with other embodiments. In accordance with an embodiment, the first field-effect transistor 910 may include a body region 101 and a well region 102 formed in the body region 101 (not shown in FIG. 9A, see e.g. FIG. 1A). Furthermore, the first field-effect transistor 910 may include a first source/drain region 103 of a first conductivity type, and a second source/drain region 104 of the first conductivity type, wherein the second source/drain region 104 may be formed in the well region 102. Furthermore, the first field-effect transistor 910 may include a pocket implant region 107 (not shown, see e.g. FIG. 1A) adjacent to the first source/drain region 103, the pocket implant region 107 being of a second conductivity type that is different from the first conductivity type. In accordance with an embodiment, the body region 101 may physically contact the pocket implant region 107. The pocket implant region 107 may be configured as described herein in connection with other embodiments. In accordance with another embodiment, the well region 102 may be of the first conductivity type, i.e. of the same conductivity type as the first and second source/drain regions 103, 104.

Figure 9B:
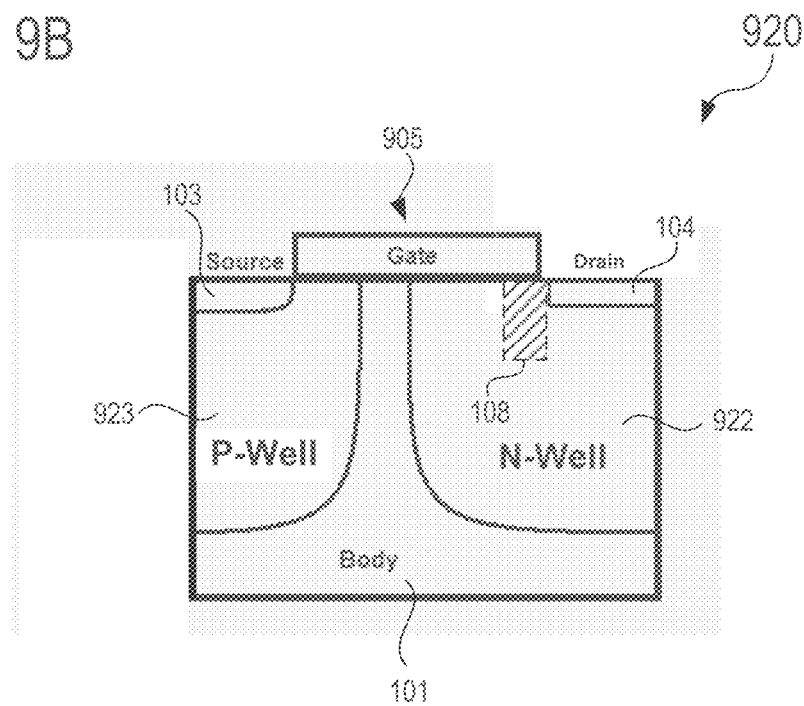
FIG. 9B shows a field-effect transistor of a field-effect transistor arrangement in accordance with an embodiment.

In accordance with an embodiment, the second field-effect transistor 920 may be configured as shown in FIG. 9B. For example, the second field-effect transistor 920 may include a body region 101, a first well region 922 formed in the body region 101, a second well region 923 formed in the body region 101, a first source/drain region 103 of the first conductivity type formed in the second well region 923, and a second source/drain region 104 of the first conductivity type formed in the first well region 922.

In accordance with an embodiment, the second field-effect transistor 920 may optionally include a shallow trench isolation region 108 (as indicated in FIG. 9B by the dashed region) disposed at least partially in the first well region 922, wherein the shallow trench isolation region 108 may be configured in a similar manner as described herein in connection with other embodiments.

In accordance with an embodiment, the first well region 922 may be of the first conductivity type, and the second well region 923 may be of the second conductivity type.

In accordance with an embodiment, the first field-effect transistor 910 and the second field-effect transistor 920 may be coupled in parallel with each other. In other words, the first source/drain regions 103 of the first and second field-effect transistors 910, 920 may be coupled to one another, and the second source/drain regions 104 of the first and second field-effect transistors 910, 920 may also be coupled to one another.

In accordance with an embodiment, the first source/drain regions 103 of the first and second field-effect transistors 910, 920 may be configured as the transistor sources, and the second source/drain regions 104 may be configured as the transistor drains.

In accordance with an embodiment, the first source/drain regions 103 of the transistors 910, 920 may be coupled to a low electrical supply potential (VSS or ground). In accordance with another embodiment, the second source/drain regions 104 of the transistors 910, 920 may be coupled to a terminal 930 (e.g. a pad).

In accordance with an embodiment, the first field-effect transistor 910 may be configured as an electrostatic discharge (ESD) protection transistor.

In accordance with an embodiment, the first field-effect transistor 910 may include a gate region 105, and the second field-effect transistor 920 may include a gate region 905.

In accordance with an embodiment, the gate region 105 of the first field-effect transistor 910 may be grounded (grounded-gate configuration), as shown in FIG. 9A. In accordance with another embodiment, the gate region 105 of the first field-effect transistor 910 may be coupled with a trigger circuit.

In accordance with an embodiment, the second field-effect transistor 920 may be configured as an input/output (I/O) transistor. The second field-effect transistor 920 (input/output transistor) may be protected against damages from ESD events by means of the first field-effect transistor 910 that may serve as an ESD protection element in the field-effect transistor arrangement 900.

In accordance with an embodiment, the first and second field-effect transistors 910, 920 may be configured as metal insulator semiconductor (MIS) field-effect transistors, for example as metal oxide semiconductor (MOS) field-effect transistors.

In one embodiment, the first and second field-effect transistors 910, 920 may be configured as NMOS devices. In this case, the first conductivity type may be an n-type conductivity type, and the second conductivity type may be a p-type conductivity type. Thus, the well region 102 of the first field-effect transistor 910 and the first well region 922 of the second field-effect transistor 920 may be configured as n-wells, and the second well region 923 of the second field-effect transistor 920 may be configured as a p-well in this case.

In accordance with an embodiment, the first field-effect transistor 910 may be configured as a grounded-gate NMOS (ggNMOS) device. In accordance with another embodiment, the first field-effect transistor 910 may be used in gate-coupled NMOS (gcNMOS) or gate triggered mode, wherein a resistance may be connected between the gate region 105 of the first field-effect transistor 910 and VSS.

The well region 102 of the first field-effect transistor 910 and the first well region 922 of the second field-effect transistor 920 may serve as drain extension of the respective field-effect transistor. Thus, the first and second field-effect transistors 910, 920 may also be referred to as drain-extended field-effect transistor devices, e.g. as DEMOS devices in case that the field-effect transistors 910, 920 are configured as MOS field-effect transistors.

A field-effect transistor arrangement in accordance with an embodiment may include a parallel combination of two DEMOS devices, wherein the first DEMOS device has a p-well and may be used for I/O operation, and the other DEMOS does not have any p-well and may be used for ESD protection.

Figure 9C:
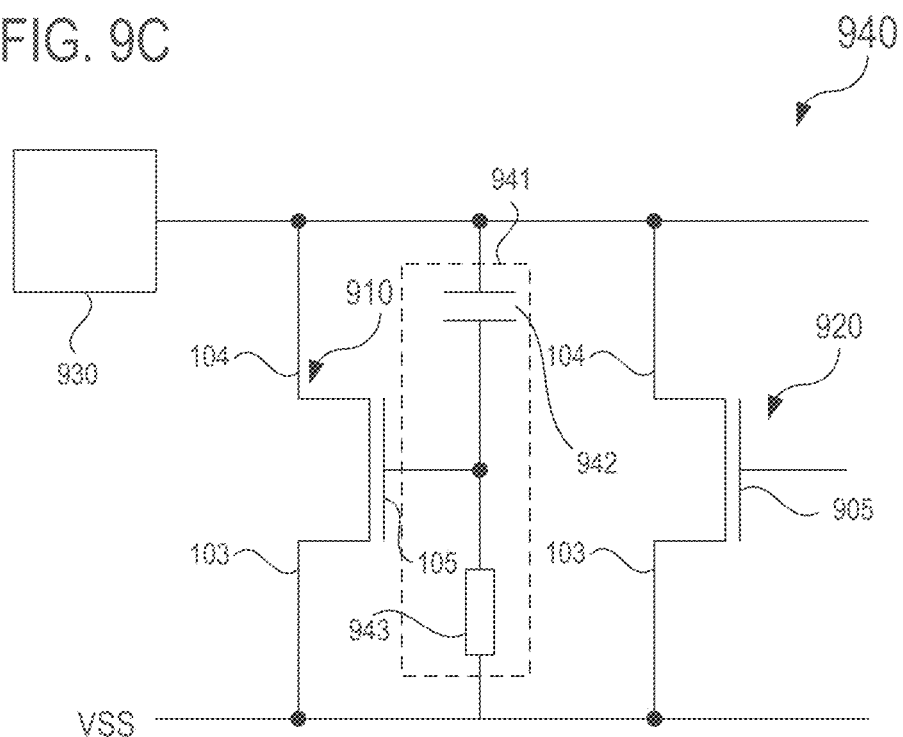
FIG. 9C shows a field-effect transistor arrangement in accordance with another embodiment.

FIG. 9C shows a field-effect transistor arrangement 940 in accordance with another embodiment. The field-effect transistor arrangement 940 includes the first field-effect transistor 910 and the second field-effect transistor 920 similar to the field-effect transistor arrangement 900 shown in FIG. 9A.

As shown in FIG. 9C, the field-effect transistor arrangement 940 may further include an electrostatic discharge protection trigger circuit 941. The electrostatic discharge protection trigger circuit 941 may include a capacitor 942 and an ohmic resistance 943, which may be coupled in series with each other. In more detail, the terminal 930 (e.g. a pad) may be coupled with a first electrode of the capacitor 942, and a second electrode of the capacitor 942 may be coupled with a first terminal of the ohmic resistance 943, a second terminal of which may be coupled to a low electrical supply potential (VSS or ground). Furthermore, a gate region of the first field-effect transistor 910 may be coupled to the second electrode of the capacitor 942 and the first terminal of the ohmic resistance 943. Illustratively, in difference to the field-effect transistor arrangement 900 shown in FIG. 9A in the field-effect transistor arrangement 940 shown in FIG. 9C, the gate region of the first field-effect transistor 910 is not coupled to a source/drain region thereof (e.g., the second source/drain region of the first field-effect transistor 910), but to the electrostatic discharge protection trigger circuit 941.

Figure 10:
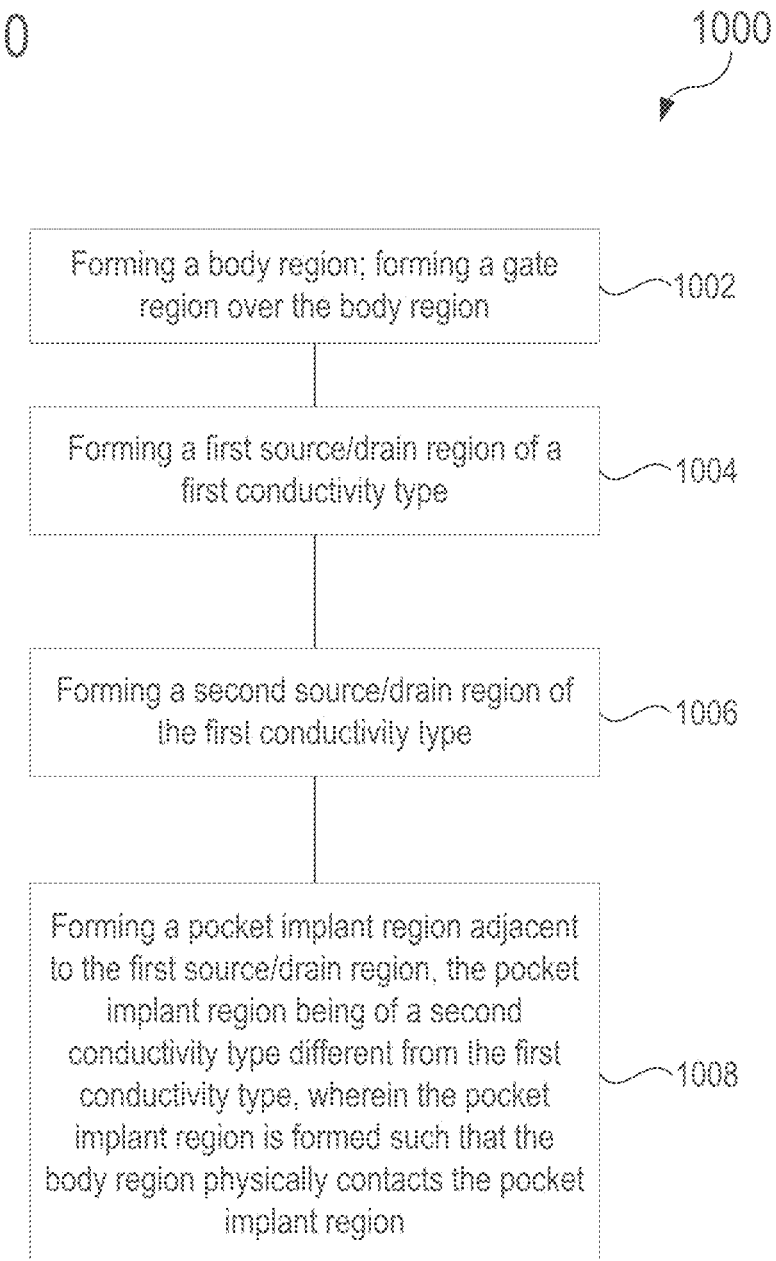
FIG. 10 shows a method for manufacturing a field-effect transistor in accordance with an embodiment.

FIG. 10 shows a method 1000 for manufacturing a field-effect transistor in accordance with an embodiment.

In 1002, a body region is formed. The body region may be formed in accordance with one or more embodiments described herein. Furthermore, a gate region may be formed over the body region in accordance with an embodiment.

In 1004, a first source/drain region of a first conductivity type is formed. The first source/drain region may be formed in accordance with one or more embodiments described herein.

In 1006, a second source/drain region of the first conductivity type is formed. The second source/drain region may be formed in accordance with one or more embodiments described herein.

In 1008, a pocket implant region is formed adjacent to the first source/drain region, the pocket implant region being of a second conductivity type different from the first conductivity type, wherein the pocket implant region is formed such that the body region physically contacts the pocket implant region. The pocket implant region may be formed in accordance with one or more embodiments described herein.

Figure 11:
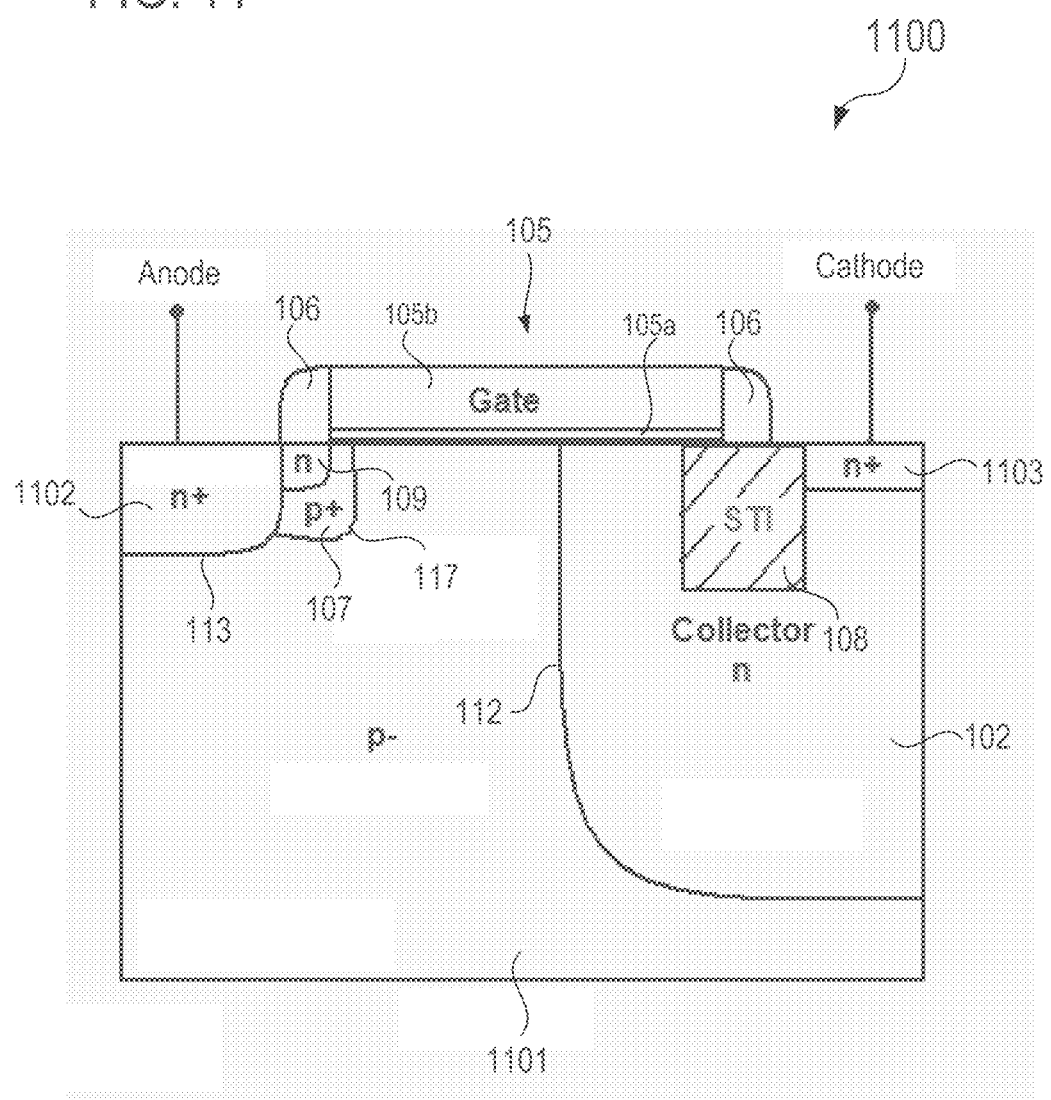
FIG. 11 shows a field-effect device in accordance with an embodiment.

FIG. 11 shows a field-effect device 1100 in accordance with an embodiment.

With respect to the general structure, the field-effect device 1100 is similar to the field-effect transistor 100 shown in FIG. 1A with some differences, which will be explained in more detail below.

To begin with, one difference is that a second highly doped region 1103 is not doped using doping atoms of the same conductivity type as the first source/drain region 103 of the field-effect transistor 100 shown in FIG. 1A, but of the opposite conductivity type (by way of example, in case the first highly doped region 1102 in the substrate 1101 is n⁺-doped, the highly doped region 1103 may be p⁺-doped; and in case the first highly doped region 1102 in the substrate 1101 is p⁺-doped, the highly doped region 1103 may be n⁺-doped). Therefore, the contact terminal contacting the first highly doped region 1102 may be referred to as anode terminal and the contact terminal contacting the second highly doped region 1103 may be referred to as cathode terminal.

In the following, other embodiments will be described.

In accordance with an embodiment, a field-effect device is provided that includes a first source/drain region of a first conductivity type, a second source/drain region of the first or of a second conductivity type, and a pocket implant region adjacent to the first source/drain region, the pocket implant region being of a second conductivity type, wherein the second conductivity type is different from the first conductivity type.

In an example of this embodiment, the field-effect device may further include a body region, wherein the body region may physically contact the pocket implant region.

In another example of this embodiment, the pocket implant region may be disposed between the first source/drain region and the second source/drain region, wherein the pocket implant region may be separated from the second source/drain region by the body region.

In yet another example of this embodiment, the field-effect device may further include a well region formed in the body region, wherein the second source/drain region may be formed in the well region. In an embodiment, the well region formed in the body region in which the second source/drain region is formed may be the only well region, in other words, first source/drain region may be formed directly in the substrate without a well region and not being formed in a well.

In yet another example of this embodiment, the pocket implant region may be separated from the well region by the body region.

In yet another example of this embodiment, the first source/drain region may be configured as a source region of the field-effect device, and the second source/drain region may be configured as a drain region of the field-effect device.

In yet another example of this embodiment, the field-effect device may be a the field-effect transistor.

In yet another example of this embodiment, the field-effect device may include a gate region including a gate-insulating layer and a conductive gate layer disposed over the gate-insulating layer.

In yet another example of this embodiment, the pocket implant region may have a common interface with the first source/drain region.

In yet another example of this embodiment, the pocket implant region may be laterally adjacent to a side of the first source/drain region that faces the gate region of the field-effect device.

In yet another example of this embodiment, the field-effect device may be configured as a metal oxide semiconductor (MOS) field-effect device.

In yet another example of this embodiment, the field-effect device may further include a shallow trench isolation (STI) region formed at least partially in the well region.

In yet another example of this embodiment, the shallow trench isolation region may be disposed proximate to the second source/drain region and between the first source/drain region and the second source/drain region, e.g. remote to the first source/drain region.

In yet another example of this embodiment, the shallow trench isolation region may be formed at least partially under the gate region.

In yet another example of this embodiment, the well region may of the first conductivity type.

In yet another example of this embodiment, the pocket implant region may be configured as a halo implant region.

In yet another example of this embodiment, the pocket implant region may be formed at least partially under the gate region.

In yet another example of this embodiment, the body region may have a doping concentration that is less than or equal to an intrinsic doping concentration. In an example, the body region may be fully depleted or partially depleted of charge carriers, thereby forming a fully depleted field-effect device or a partially depleted field-effect device, respectively.

In yet another example of this embodiment, the field-effect device may further include a lightly doped drain region disposed laterally adjacent to the second source/drain region.

In yet another example of this embodiment, the lightly doped drain region may be of the first conductivity type.

In yet another example of this embodiment, the field-effect device may have a graded doping profile at the side of the first source/drain region.

In yet another example of this embodiment, the field-effect device may further include a second well region, wherein the first source/drain region may be partially formed in the second well region.

In yet another example of this embodiment, the second well region may be of the second conductivity type.

In yet another example of this embodiment, the first conductivity type may be an n-type conductivity type, and the second conductivity type may be a p-type conductivity type.

In yet another example of this embodiment, the first conductivity type may be a p-type conductivity type, and the second conductivity type may be an n-type conductivity type.

In yet another example of this embodiment, the field-effect device may be configured as an electrostatic discharge protection device, e.g. as an electrostatic discharge protection transistor.

In accordance with another embodiment, a field-effect device is provided that may include a body region, a well region formed in the body region, a first source/drain region of a first conductivity type, an implant region adjacent to the first source/drain region, the implant region being of a second conductivity type different from the first conductivity type, wherein the implant region may have a doping concentration different from a well doping concentration, and a second source/drain region of the first conductivity type or of a second conductivity type formed in the well region, wherein the body region may physically contact the implant region.

In an example of this embodiment, the well region may be of the first conductivity type.

In another example of this embodiment, the field-effect device may include a gate region including a gate-insulating layer and a conductive gate layer disposed over the gate-insulating layer.

In yet another example of this embodiment, the first source/drain region may be configured as a source region of the field-effect device, and the second source/drain region may be configured as a drain region of the field-effect device.

In yet another example of this embodiment, the field-effect device may be a the field-effect transistor.

In yet another example of this embodiment, the field-effect device may be configured as a metal oxide semiconductor field-effect device.

In yet another example of this embodiment, the field-effect device may further include a shallow trench isolation region formed at least partially in the well region.

In yet another example of this embodiment, the shallow trench isolation region may be disposed laterally adjacent to the second source/drain region.

In yet another example of this embodiment, the shallow trench isolation region may be formed at least partially under the gate region.

In yet another example of this embodiment, the implant region may be formed at least partially under the gate region.

In yet another example of this embodiment, the implant region may be configured as a pocket implant region.

In yet another example of this embodiment, the body region may have a doping concentration that is less than or equal to an intrinsic doping concentration. In an example, the body region may be fully depleted or partially depleted of charge carriers, thereby forming a fully depleted field-effect device or a partially depleted field-effect device, respectively.

In yet another example of this embodiment, the field-effect device may further include a lightly doped drain region disposed laterally adjacent to the second source/drain region.

In yet another example of this embodiment, the lightly doped drain region may be of the first conductivity type.

In yet another example of this embodiment, the field-effect device may may have a graded doping profile at the side of the first source/drain region.

In yet another example of this embodiment, the field-effect device may further include a second well region, wherein the first source/drain region may be partially formed in the second well region.

In yet another example of this embodiment, the second well region may be of the second conductivity type.

In yet another example of this embodiment, the first conductivity type may be an n-type conductivity type, and the second conductivity type may be a p-type conductivity type.

In yet another example of this embodiment, the first conductivity type may be a p-type conductivity type, and the second conductivity type may be an n-type conductivity type.

In yet another example of this embodiment, the field-effect device may be configured as an electrostatic discharge protection device, e.g. as an electrostatic discharge protection transistor.

In accordance with another embodiment, a field-effect transistor device is provided that may include a body region, a first source/drain region of a first conductivity type, a second source/drain region of the first conductivity type or of a second conductivity type, an implant region adjacent to the first source/drain region, the implant region being of a second conductivity type different from the first conductivity type, wherein the implant region may have a doping concentration different from a well doping concentration, and wherein the body region may physically contact the implant region.

In an example of this embodiment, the field-effect device may further include a well region formed in the body region, wherein the second source/drain region may be formed in the well region.

In another example of this embodiment, the well region may be of the first conductivity type.

In yet another example of this embodiment, the field-effect device may include a gate region including a gate-insulating layer and a conductive gate layer disposed over the gate-insulating layer.

In yet another example of this embodiment, the first source/drain region may be configured as a source region of the field-effect device, and the second source/drain region may be configured as a drain region of the field-effect device.

In yet another example of this embodiment, the field-effect device may be a the field-effect transistor.

In yet another example of this embodiment, the field-effect transistor may be configured as a metal oxide semiconductor field-effect device.

In yet another example of this embodiment, the field-effect device may further include a shallow trench isolation region.

In yet another example of this embodiment, the shallow trench isolation region may be disposed laterally adjacent to the second source/drain region.

In yet another example of this embodiment, the shallow trench isolation region may be formed at least partially in the well region.

In yet another example of this embodiment, the shallow trench isolation region may be formed at least partially under the gate region.

In yet another example of this embodiment, the implant region may be formed at least partially under the gate region.

In yet another example of this embodiment, the implant region may be configured as a pocket implant region.

In yet another example of this embodiment, the body region may have a doping concentration that is less than or equal to an intrinsic doping concentration. In an example, the body region may be fully depleted or partially depleted of charge carriers, thereby forming a fully depleted field-effect device or a partially depleted field-effect device, respectively.

In yet another example of this embodiment, the field-effect device may further include a lightly doped drain region disposed laterally adjacent to the second source/drain region.

In yet another example of this embodiment, the lightly doped drain region may be of the first conductivity type.

In yet another example of this embodiment, the field-effect device may have a graded doping profile at the side of the first source/drain region.

In yet another example of this embodiment, the field-effect device may further include a second well region, wherein the first source/drain region may be partially formed in the second well region.

In yet another example of this embodiment, the second well region may be of the second conductivity type.

In yet another example of this embodiment, the field-effect device may be configured as an electrostatic discharge protection transistor.

In yet another example of this embodiment, the first conductivity type may be an n-type conductivity type, and the second conductivity type may be a p-type conductivity type.

In yet another example of this embodiment, the first conductivity type may be a p-type conductivity type, and the second conductivity type may be an n-type conductivity type.

In accordance with another embodiment, a field-effect device arrangement is provided that may include a first field-effect device including a body region, a first well region formed in the body region, a first source/drain region of a first conductivity type, a pocket implant region adjacent to the first source/drain region, the pocket implant region being of a second conductivity type different from the first conductivity type, a second source/drain region of the first conductivity type or of the second conductivity type formed in the first well region, wherein the body region may physically contact the pocket implant region; and a second field-effect device including a body region, a first well region formed in the body region, a second well region formed in the body region, a first source/drain region of the first conductivity type formed in the second well region, and a second source/drain region of the first conductivity type formed in the first well region.

In an example of this embodiment, the first field-effect device and the second field-effect device may be coupled in parallel with each other.

In another example of this embodiment, the first field-effect device may be configured as an electrostatic discharge protection device, e.g. as an electrostatic discharge protection transistor.

In yet another example of this embodiment, the second field-effect device may be configured as an input/output transistor.

In yet another example of this embodiment, the first field-effect device and the second field-effect device may each include a gate region including a gate-insulating layer and a conductive gate layer disposed over the gate-insulating layer.

In yet another example of this embodiment, the first source/drain region of the first and second field-effect devices may be configured as source regions of the field-effect devices, and the second source/drain regions of the first and second field-effect devices may be configured as drain regions of the field-effect devices.

In yet another example of this embodiment, the first field-effect device and the second field-effect device may be configured as metal oxide semiconductor (MOS) field-effect devices.

In yet another example of this embodiment, the first field-effect device may be configured as an NMOS field-effect device, e.g. as an NMOS field-effect transistor.

In yet another example of this embodiment, the first field-effect device may be configured as a PMOS field-effect device, e.g. as a PMOS field-effect transistor.

In yet another example of this embodiment, the first field-effect device may be configured as grounded-gate field-effect device, e.g. as a grounded-gate field-effect transistor. In other words, a grounded-gate configuration (e.g. a grounded-gate NMOS configuration) may be realized in the first field-effect device.

In yet another example of this embodiment, the field-effect device arrangement may further include a trigger circuit, and the gate of the first field-effect device may be controlled by the trigger circuit.

In yet another example of this embodiment, the first field-effect device may further include a shallow trench isolation region formed at least partially in the well region.

In yet another example of this embodiment, the shallow trench isolation region may be disposed laterally adjacent to the second source/drain region.

In yet another example of this embodiment, the shallow trench isolation region may be formed at least partially under the gate region of the first field-effect device.

In yet another example of this embodiment, the pocket implant region may be formed at least partially under the gate region of the first field-effect device.

In yet another example of this embodiment, the body regions may have a doping concentration that is less than or equal to an intrinsic doping concentration.

In yet another example of this embodiment, the first field-effect device further may include a lightly doped drain region disposed laterally adjacent to the second source/drain region.

In yet another example of this embodiment, the the first field-effect device may have a graded doping profile at the side of the first source/drain region.

In yet another example of this embodiment, the first field-effect device may further include a second well region, wherein the first source/drain region of the first field-effect device may be partially formed in the second well region.

In yet another example of this embodiment, the second well region may be of the second conductivity type.

In yet another example of this embodiment, the first conductivity type may be an n-type conductivity type, and the second conductivity type may be a p-type conductivity type.

In yet another example of this embodiment, the first conductivity type may be a p-type conductivity type, and the second conductivity type may be an n-type conductivity type.

In accordance with another embodiment, a method for manufacturing a field-effect device is provided that may include forming a body region, forming a first source/drain region of a first conductivity type, forming a pocket implant region adjacent to the first source/drain region, the pocket implant region being of a second conductivity type, wherein the second conductivity type may be different from the first conductivity type, wherein the pocket implant region may be formed such that the body region physically contacts the pocket implant region.

In an example of this embodiment, the method may further include forming a second source/drain region of the first conductivity type or of a second conductivity type.

In another example of this embodiment, the method may further include forming a well region in the body region, wherein the second source/drain region is formed in the well region.

In yet another example of this embodiment, the method may further include forming a gate region including a gate-insulating layer and a conductive gate layer disposed over the gate-insulating layer.

In yet another example of this embodiment, the field-effect device may be configured as a metal oxide semiconductor field-effect device.

In yet another example of this embodiment, the method may further include forming a shallow trench isolation region.

In yet another example of this embodiment, the shallow trench isolation region may be formed laterally adjacent to the second source/drain region.

In yet another example of this embodiment, the shallow trench isolation region may be formed at least partially in the well region.

In yet another example of this embodiment, the well region may be formed such that it is of the first conductivity type.

In yet another example of this embodiment, the body region may be formed such that it has a doping concentration that is less than or equal to an intrinsic doping concentration.

In yet another example of this embodiment, the method may further include forming a lightly doped drain region laterally adjacent to the second source/drain region.

In yet another example of this embodiment, the lightly doped drain region may be formed such that it is of the first conductivity type.

In yet another example of this embodiment, the field-effect device may be formed such that is has a graded doping profile at the side of the first source/drain region.

In yet another example of this embodiment, the method may further include forming a second well region, wherein the first source/drain region may be formed partially in the second well region.

In yet another example of this embodiment, the second well region may be formed such that it is of the second conductivity type.

In yet another example of this embodiment, the device may be formed as an electrostatic discharge protection device.

In yet another example of this embodiment, the first conductivity type may be an n-type conductivity type, and the second conductivity type may be a p-type conductivity type.

In yet another example of this embodiment, the first conductivity type may be a p-type conductivity type, and the second conductivity type may be an n-type conductivity type.

In yet another example of this embodiment, the field-effect device arrangement may further include an electrostatic discharge protection trigger circuit. A gate region of the first field-effect device may be coupled to the electrostatic discharge protection trigger circuit.

In yet another example of this embodiment, a gate region of the first field-effect device may be coupled to the second source/drain region of the first field-effect device.

In accordance with another embodiment, a method for operating a field-effect device arrangement is provided, wherein the the first field effect device of the field-effect device arrangement as described above is used as an electrostatic discharge protection device.

In the following, certain features and potential effects of illustrative embodiments are described.

In accordance with some embodiments, field-effect transistor devices are provided that may, for example, be used as power clamps or as robust ESD protection elements which may be compliant with interface voltages of e.g. about 5 V to 12 V for an I/O circuit implemented in a system on chip (SoC).

In accordance with an embodiment, an ESD protection device for high voltage interfaces based on a modified drain-extended MOS device is provided. Specific features of this device include:

1) Blocking of a p-well implant in the body/base area and underneath the source region. This may increase the base resistance of the underlying bipolar transistor significantly and may reduce the triggering voltage of the ESD protection element leading to a better voltage clamping under ESD conditions.

2) Adding a p+ pocket at the source side. The p+ pocket may control the leakage current in the off-state of a $V_T$ and p-well blocked device and may also improve the beta (current gain) of the bipolar triggered under ESD because of a graded base nature.

In accordance with another embodiment, an ESD protection element is provided that includes a single halo implant (or pocket implant) at the source side and blocking of the p-well in a standard STI-type DEMOS process. The single halo implant (pocket implant) may control the leakage current in the off-state and may improve the β (current gain) of the transistor. Blocking the p-well may increase the substrate resistance significantly and may reduce the triggering voltage.

Embodiments may be realized in standard CMOS technology and may include the following features or effects:

1) CMOS process compatibility. No additional mask may be needed for the manufacturing.

2) Using a single halo implant may help to improve the current gain of the parasitic bipolar transistor. Furthermore, it may control the leakage current which may be a concern in protection devices.

3) Using an intrinsic or lowly doped p-substrate may help to increase the substrate resistance which may lead to a low trigger voltage.

4) Using an n-well may relax the drain-to-substrate electric field. The heat dissipation is given as J×E (i.e., product of current density J and electric field E). Relaxing the electric field near the junction may help to reduce self-heating of the device. Furthermore, a deep well may help to spread the injected current deeper into the substrate which may lead to a reduced current density. Since the failure threshold of a device depends on self-heating, a deep n-well that relaxes the self-heating in the device may eventually lead to a high failure threshold. Furthermore, the n-well may contribute to the drain resistance which may provide improved ballasting.

5) A shallow trench isolation (STI) below the drain-gate edge may help to bend the injected current towards or deep into the n-well region. This spreading may help to relax the current density. It may also relax the gate oxide field near the drain edge. A high gate oxide field may cause TDDB (time-dependent dielectric breakdown), which may be a reliability concern for ggNMOS protection devices.

6) Moving current filaments in the device may provide robustness against ESD events.

In accordance with some embodiments, field-effect transistor devices are provided wherein a p-well is blocked to improve the parasitic bipolar effect in the devices.

In accordance with an embodiment, a graded doping profile may be provided at the source side of a field-effect transistor device to improve the parasitic bipolar effect and ESD failure threshold of the device.

In accordance with an embodiment, a halo implant (pocket implant) may be used to form a p+ pocket near the source of a field-effect transistor device, which may control the leakage current.

In accordance with an embodiment, the pocket implant may improve the bipolar triggering because of the graded base nature of the NPN.

In accordance with an embodiment, an n-well may be formed that may help to spread charge carriers into the deep substrate region.

In accordance with an embodiment, a shallow trench isolation (STI) may be formed underneath the gate-drain overlap that may help to protect the gate oxide from failure at high transient voltages.

In accordance with an embodiment, a lowly doped substrate in combination with the pocket implant may improve the bipolar speed. A high bipolar speed may cause moving current filaments, which may eventually lead to a robust device.

In accordance with an embodiment, a field-effect transistor arrangement with a parallel combination of two DEMOS devices may be provided, wherein a first DEMOS device has a p-well and is used for I/O operation, and wherein a second DEMOS does not have any p-well and is used for ESD protection.

In accordance with an embodiment, the combination of a p+ pocket implant and blocking the p-well implant may be used in all versions of NMOS devices such as, for example, LDDMOS (laterally double diffused MOS) or RESURF devices, DEMOS devices (with or without STI), LDMOS (laterally diffused MOS) devices or DMOS (double diffused MOS) devices and standard core NMOS devices.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for manufacturing a field-effect device, the method comprising:

forming a body region of a second conductivity type;

forming a well region in the body region;

forming a first source/drain region of a first conductivity type;

forming a second source/drain region in the well region, the second source/drain region being of the first conductivity type or of the second conductivity type;

forming a doped region of the first conductivity type disposed laterally adjacent to the first source/drain region, a doping concentration level in the doped region being lower than a doping concentration level of the first source/drain region; and forming a pocket implant region adjacent to the first source/drain region, the pocket implant region being of the second conductivity type, wherein the pocket implant region comprises a first subregion adjacent to the first source/drain region and a second subregion adjacent to the first subregion and between the first subregion and the body region, a doping concentration level in the first subregion of the pocket implant region being higher than a doping concentration level of the well region and being higher than a doping concentration level of the body region, and further being higher than the doping concentration level in the doped region, and a doping concentration level in the second subregion of the pocket implant region being lower than the doping concentration level of the first subregion and being higher than the doping concentration level of the body region, wherein the pocket implant region is formed such that the body region physically contacts the pocket implant region.

2. The method of claim 1, further comprising forming a shallow trench isolation region at least partially in the well region.

3. The method of claim 2, wherein the shallow trench isolation region is formed proximate to the second source/drain region, and between the first source/drain region and the second source/drain region.

4. The method of claim 3, further comprising forming a gate over the body region, wherein the gate partially overlaps the shallow trench isolation region.

5. The method of claim 1, wherein the well region is of the first conductivity type.

6. The method of claim 1, the body region has a doping concentration that is equal to an intrinsic doping concentration.

7. The method of claim 1, further comprising forming a lightly doped drain region laterally adjacent to the second source/drain region.

8. The method of claim 1, wherein the field-effect device is an electrostatic discharge protection device.

9. The method of claim 1, wherein the field-effect device is a field-effect transistor, wherein the first source/drain region is a source region and the second source/drain region is a drain region of the field-effect transistor.

10. The method of claim 1, wherein forming the pocket implant region comprises implanting dopants of the second conductivity type into the body region adjacent to the first source/drain region at a tilt angle.

11. A method for operating a field-effect device, the method comprising:

using a field effect device as an electrostatic discharge protection device, wherein the field effect device comprises:
a body region of a second conductivity type;
a well region formed in the body region;
a first source/drain region of a first conductivity type;
a second source/drain region of the first conductivity type or of the second conductivity type disposed in the well region;
a doped region of the first conductivity type disposed laterally adjacent to the first source/drain region, a doping concentration level in the doped region being lower than a doping concentration level of the first source/drain region; and
a pocket implant region adjacent to the first source/drain region, the pocket implant region being of the second conductivity type and comprising a first subregion adjacent to the first source/drain region and a second subregion adjacent to the first subregion and between the first subregion and the body region, a doping concentration level in the first subregion of the pocket implant region being higher than a doping concentration level of the well region and being higher than a doping concentration level of the body region, and further being higher than the doping concentration level of the doping region, and a doping concentration level in the second subregion of the pocket implant region being lower than the doping concentration level in the first subregion of the pocket implant region and being higher than the doping concentration level of the body region, wherein the second conductivity type is different from the first conductivity type, and wherein the body region physically contacts the pocket implant region.

12. The method of claim 11, wherein the field effect device further comprises a shallow trench isolation region formed at least partially in the well region.

13. The method of claim 12, wherein the shallow trench isolation region is disposed proximate to the second source/drain region, and between the first source/drain region and the second source/drain region.

14. A method for operating an electrostatic discharge protection circuit, the method comprising:

coupling a first field-effect transistor in parallel with a second field-effect transistor in the circuit, wherein the first field effect transistor comprises:
a body region of a second conductivity type;
a well region formed in the body region;
a first source/drain region of a first conductivity type, wherein the first source/drain region is a source region of the transistor;
a second source/drain region of the first conductivity type or of the second conductivity type disposed in the well region, wherein the second source/drain region is a drain of the transistor;
a doped region of the first conductivity type disposed laterally adjacent to the first source/drain region, a doping concentration level in the doped region being lower than a doping concentration level of the first source/drain region; and
a pocket implant region adjacent to the first source/drain region, the pocket implant region being of the second conductivity type and comprising a first subregion adjacent to the first source/drain region and a second subregion adjacent to the first subregion and between the first subregion and the body region, a doping concentration level in the first subregion of the pocket implant region being higher than a doping concentration level of the well region and being higher than a doping concentration level of the body region, and further being higher than the doping concentration level of the doping region, and a doping concentration level in the second subregion of the pocket implant region being lower than the doping concentration level in the first subregion of the pocket implant region and being higher than the doping concentration level of the body region, wherein the second conductivity type is different from the first conductivity type, and wherein the body region physically contacts the pocket implant region.

15. The method of claim 14, wherein the second field-effect transistor comprises:
- a body region;
- a first well region disposed in the body region;
- a second well region disposed in the body region;
- a first source/drain region of the first conductivity type disposed in the second well region; and
- a second source/drain region of the first conductivity type formed in the first well region.

16. The method of claim 15, wherein the first source/drain region of the first field-effect transistor is coupled to the first source/drain region of the second field-effect transistor and the second source/drain region of the first field-effect transistor is coupled to the second source/drain region of the second field-effect transistor.

17. The method of claim 16, wherein the first field-effect transistor further comprises a gate region, wherein the gate region is coupled to the second source/drain region of the first field-effect transistor.

18. The method of claim 16, wherein the first field-effect transistor further comprises a gate region, the gate region is coupled to an electrostatic discharge protection trigger circuit, wherein the electrostatic discharge protection trigger circuit comprises a capacitor and an ohmic resistance, wherein the capacitor and ohmic resistance are coupled in series.

19. The method of claim 18, wherein the capacitor comprises a first terminal and a second terminal, and the ohmic resistance comprises a first terminal and a second terminal, wherein the first terminal of the capacitor is coupled to the first source/drain regions of the first and second field-effect transistors, and the second terminal of the capacitor is coupled to a first terminal of the ohmic resistance and the gate region of the first field-effect transistor, and wherein the first terminal of the ohmic resistance is coupled to the second terminal of the capacitor and the gate region of the first field-effect transistor, and the second terminal of the ohmic resistance is coupled to the second source/drain regions of the first and second field-effect transistors.

20. The method of claim 14, wherein the second transistor is an input/output transistor.

* * * * *